United States Patent
Khsiba et al.

(10) Patent No.: US 10,116,326 B2
(45) Date of Patent: Oct. 30, 2018

(54) SEMI-EXHAUSTIVE RECURSIVE BLOCK DECODING METHOD AND DEVICE

(71) Applicant: INSTITUT MINES-TELECOM, Paris (FR)

(72) Inventors: Mohamed-Achraf Khsiba, Paris (FR); Ghaya Rekaya Ben-Othman, Paris (FR); Asma Mejri, Antibes (FR)

(73) Assignee: INSTITUT MINES-TELECOM, Paris (FR)

( * ) Notice: Subject to any disclaimer, the term of this patent is extended or adjusted under 35 U.S.C. 154(b) by 37 days.

(21) Appl. No.: 15/348,247

(22) Filed: Nov. 10, 2016

(65) Prior Publication Data
US 2017/0141788 A1    May 18, 2017

(30) Foreign Application Priority Data

Nov. 13, 2015  (EP) ..................................... 15306808

(51) Int. Cl.
*H03M 7/30* (2006.01)
*H03M 13/00* (2006.01)
(Continued)

(52) U.S. Cl.
CPC ....... *H03M 7/3082* (2013.01); *H03M 13/616* (2013.01); *H04L 25/03242* (2013.01);
(Continued)

(58) Field of Classification Search
CPC .............. H03M 7/3082; H03M 13/616; H04L 25/03242; H04L 25/0204; H04L 25/0246; H04L 2025/03426; H04W 88/02
See application file for complete search history.

(56) References Cited

U.S. PATENT DOCUMENTS

| 7,230,973 B2 * | 6/2007 | Brunel | ............... H04B 1/71057 375/130 |
| 8,737,540 B1 * | 5/2014 | Shi | ........................ H04L 25/067 375/340 |

(Continued)

OTHER PUBLICATIONS

C. P. Schnorr and M. Euchner. Lattice Basis Reduction: Improved Practical Algorithms and Solving Subset Sum Problems. In Math. Programming, pp. 181-191, 1993.
(Continued)

*Primary Examiner* — Freshteh N Aghdam
(74) *Attorney, Agent, or Firm* — Meagher Emanuel Laks Goldberg & Liao, LLP

(57) ABSTRACT

Embodiments of the invention provides a decoder for decoding a signal received through a transmission channel in a communication system, said signal carrying information symbols selected from a given alphabet and being associated with a signal vector, said transmission channel being represented by a channel matrix, wherein said decoder comprises:
a sub-block division unit (301) configured to divide the received signal vector into a set of sub-vectors in correspondence with a division of a matrix related to said channel matrix;
a candidate set estimation unit (305) for recursively determining candidate estimates of sub-blocks of the transmitted signal corresponding to said sub-vectors, each estimate of a given sub-block being determined from at least one candidate estimate of the previously processed sub-blocks,
wherein said candidate set estimation unit is configured to determine a set of candidate estimates for at least one sub-block of the transmitted signal by applying at least one iteration of a decoding algorithm using the estimates determined for the previously processed sub-blocks, the number of candidate estimates determined
(Continued)

for said sub-block being strictly inferior to the cardinal of the alphabet and superior or equal to two, the decoder further comprising a signal estimation unit (306) for calculating an estimate of the transmitted signal from said candidate estimates determined for said sub-blocks.

29 Claims, 11 Drawing Sheets

(51) Int. Cl.
    *H04L 25/03*     (2006.01)
    *H04W 88/02*     (2009.01)
    *H04L 25/02*     (2006.01)

(52) U.S. Cl.
    CPC ...... *H04L 25/0204* (2013.01); *H04L 25/0246* (2013.01); *H04L 2025/03426* (2013.01); *H04W 88/02* (2013.01)

(56) References Cited

U.S. PATENT DOCUMENTS

| | | | |
|---|---|---|---|
| 9,143,376 B2* | 9/2015 | Jalloul | H04L 27/2649 |
| 9,654,252 B2* | 5/2017 | Dhayni | H04B 7/0413 |
| 2007/0286313 A1* | 12/2007 | Nikopour-Deilami | H04L 1/005 |
| | | | 375/341 |
| 2008/0049863 A1* | 2/2008 | Heiskala | H04L 1/06 |
| | | | 375/267 |
| 2009/0103641 A1 | 4/2009 | Masui et al. | |
| 2010/0272220 A1* | 10/2010 | Murai | H04B 7/0413 |
| | | | 375/346 |
| 2011/0096858 A1* | 4/2011 | Klimer | H04B 7/0854 |
| | | | 375/267 |
| 2012/0155579 A1* | 6/2012 | Zilberman | H04L 25/03216 |
| | | | 375/341 |
| 2015/0098402 A1* | 4/2015 | Tomeba | H04B 7/04 |
| | | | 370/329 |

OTHER PUBLICATIONS

B. Hassibi and H. Vikalo. On the sphere-decoding algorithm i. expected complexity. Signal processing, IEEE Transactions on, 53(8):2806-2818, Aug. 2005.

Byonghyo Shim and Insung Kang. Sphere decoding with a probabilistic tree pruning. Signal Processing, IEEE Transactions on, 56(10):4867-4878, Oct. 2008.

Tao Cui, Shuangshuang Han, and C. Tellambura. Probability distribution-based node pruning for sphere decoding. Vehicular Technology, IEEE Transactions on, 62(4):1586-1596, May 2013.

Qingwei Li and Zhongfeng Wang. Improved kbest sphere decoding algorithms for mimo systems. In Circuits and Systems, 2006.ISCAS 2006. Proceedings. 2006 IEEE International Symposium on, pp. 4 pp. 1162, May 2006.

R. Gowaikar and B. Hassibi. Statistical pruning for near maximum likelihood decoding. Signal Processing, IEEE Transactions on, 55(6):2661-2675, Jun. 2007.

Won-Joon Choi, R. Negi, and J.M. Cioffi. Combined ML and DFE decoding for the v-blast system. In Communications, 2000.ICC 2000. 2000 IEEE International Conference on, vol. 3, pp. 1243-1248 vol. 3, 2000.

S.D. Howard, S. Sirianunpiboon, and A.R. Calderbank. Low Complexity Essentially Maximum Likelihood Decoding of Perfect Space-Time Block Codes. In Acoustics, Speech and Signal Processing, 2009. ICASSP 2009.

L.P. Natarajan and B.S. Rajan. An Adaptive Conditional Zero-Forcing Decoder with Full-diversity, Least Complexity and Essentially-ML Performance for STBCs. In Information Theory and its Applications (ISITA), 2012 International Symposium on, pp. 235-239, Oct. 2012.

J. -C. Belfiore, G. Rekaya, E. Viterbo. The Golden Code: A 2x2 Full-Rate Space-Time Code with Non-Vanishing Determinants, IEEE Transactions on Information Theory, vol. 51, No. 4, pp. 1432-1436, Apr. 2005.

G.R. Ben-Othman, R. Ouertani, and A. Salah, entitled "The Spherical Bound Stack Decoder", In Proceedings of International Conference on Wireless and Mobile Computing, pp. 322-327, Oct. 2008.

A. Salah, G. Othman, R. Ouertani, and S. Guillouard. New soft stack decoder for mimo channel. In Signals, Systems and Computers, 2008 42nd Asilomar Conference on, pp. 1754-1758, Oct. 2008.

European Search Report for 15306808.5 dated May 20, 2016.

Tao Cui, et al., "Probability-Distribution-Based Node Pruning for Sphere Decoding", IEEE Transactions on Vehicular Technology, IEEE Service Center, Piscataway, NJ, US, vol. 62, No. 4, May 1, 2013 (May 1, 2013). pp. 1586-1596.

Tao Cui, et al., "Statistical Pruning for Near Maximum Likelihood Detection of MIMO Systems", Proceedings of the 2007 IEEE International Conference on Communications (ICC 2007), Jun. 24-28, 2007, Glasgow, UK, IEEE, Piscataway, NJ, US, Jun. 1, 2007 (Jun. 1, 2007), pp. 5462-5467.

\* cited by examiner

SEMI-EXHAUSTIVE RECURSIVE BLOCK DECODING METHOD AND DEVICE

BACKGROUND

The invention generally relates to digital communication and in particular to methods, systems, and computer program products for decoding a received data signal.

In recent years, wireless communication systems have grown at an accelerated pace, thereby becoming central components of modern modes of communications.

Different wireless communication systems are available today, such as the cellular and wireless ad-hoc networks accommodating single or multiple transmitters/receivers using single or multiple antennas, such as MIMO (Multiple INPUT Multiple OUTPUT) systems. A wireless MIMO communication system refers to radio links with multiple antennas at the transmitter side and at the receiver side.

The significant development of MIMO systems over scattering-rich wireless channels is due to their ability to meet the increasing needs in terms of communication reliability and data rate on wireless networks.

Many decoders have been proposed to retrieve signal streams sent over such wireless communication systems with an improved performance in terms of data rate and reliability. However, a major challenge of such decoders is the complexity cost. In order to warrant the deployment for real-time and high-throughput applications, it is desirable that the coding operations and decoding algorithms satisfy the prescribed computational complexity which is fixed for a given device and application.

For example, Maximum Likelihood (ML) decoders, such as the sphere decoder (E. Viterbo and E. Biglieri. A universal decoding algorithm for lattice codes. In Quatorzieme colloque GRETSI, 1993) or the Schnorr Euchner decoder (C. P. Schnorr and M. Euchner. Lattice Basis Reduction: Improved Practical Algorithms and Solving Subset Sum Problems. In Math. Programming, pages 181-191, 1993) are optimal decoders which require an exponential complexity in the number of antennas (B. Hassibi and H. Vikalo. On the sphere-decoding algorithm i. expected complexity. Signal processing, IEEE Transactions on, 53(8):2806-2818, August 2005).

These decoders have been adapted to reduce their complexity at a possible cost of performance degradation in terms of a tradeoff between complexity and performance, according to two different approaches. In a first approach, the decoder is based on a node pruning-based tree search algorithm which is configured to discard some nodes (and their children) in each layer if they are associated with a low likelihood function to lead to the optimal solution. Exemplary decoders operating according to this first approach comprise for example:

probabilistic tree pruning sphere decoding (Byonghyo Shim and Insung Kang. Sphere decoding with a probabilistic tree pruning. Signal Processing, IEEE Transactions on, 56(10):4867-4878, October 2008; Tao Cui, Shuangshuang Han, and C. Tellambura. Probability distribution-based node pruning for sphere decoding. Vehicular Technology, IEEE Transactions on, 62(4): 1586-1596, May 2013);

the k-best algorithms (Qingwei Li and Zhongfeng Wang. Improved k-best sphere decoding algorithms for mimo systems. In Circuits and Systems, 2006. ISCAS 2006. Proceedings. 2006 IEEE International Symposium on, pages 4 pp.-1162, May 2006); and increasing radii algorithms (R. Gowaikar and B. Hassibi. Statistical pruning for near maximum likelihood decoding. Signal Processing, IEEE Transactions on, 55(6): 2661-2675, June 2007).

The second approach relates to iterative decoders. An iterative decoder is based on the equivalent channel matrix form induced from the code structure to determine partitioned signal sets to be decoded iteratively. Such iterative approach reduces the decoding complexity while not maintaining a desired error performance and full diversity.

For example, in the article "Won-Joon Choi, R. Negi, and J. M. Cioffi. Combined ML and DFE decoding for the v-blast system. In Communications, 2000. ICC 2000. 2000 IEEE International Conference on, volume 3, pages 1243-1248 vol. 3, 2000", the channel matrix is divided into two blocks, the first block having a size q. An ML decoding scheme is performed on the first block of size q, while a decision feedback equalizer (also referred to as ZF-DFE) is applied to the remaining system given the output of the ML decoding performed on the first block (i.e. the ML output is subtracted from the received signal). Even if such solution increases the performance, the decoding is sub-optimal while not ensuring a target diversity order.

Another solution, proposed for space-time coded systems which are compatible with sphere decoders, consists in splitting the received signal into a number L ($L \geq 2$) of subsets each of a given cardinality $\lambda$. A conditional maximization of a likelihood function with respect to one of set of signal points given another is performed. This comprises:

Dividing the equivalent channel matrix into L sub-matrices with accordance to the splitting of the received signal;

Selecting, among the L sub-sets of the received signal, a signal set according to a given criterion;

For all the possible values of the remaining L−1 subsets taken from the alphabet, performing a conditional ZF (ACZF) or ZF-DFE (ACZF-SIC) detection (also referred to hereinafter as 'decoding') of the selected signal sub-set after removing the inter-sub-sets interference;

Selecting, among the overall calculated solutions the optimal one which corresponds to the minimization of the Euclidean distance between the received signal and the estimated one.

The choice of the signal set to be detected (also referred to hereinafter as 'decoded') conditioned on the values of the remaining signal sub-sets has an impact on the performance of the algorithm. Inspired from the work disclosed in S. D. Howard, S. Sirianunpiboon, and A. R. Calderbank. Low Complexity Essentially Maximum Likelihood Decoding of Perfect Space-Time Block Codes. In Acoustics, Speech and Signal Processing, 2009. ICASSP 2009. IEEE International, a selection criterion for n×n space-time coded systems using the Perfect codes has been proposed in L. P. Natarajan and B. S. Rajan. An Adaptive Conditional Zero-Forcing Decoder with Full-diversity, Least Complexity and Essentially-ML Performance for STBCs. In Information Theory and its Applications (ISITA), 2012 International Symposium on, pages 235-239, October 2012, particularly for a 2×2 MIMO system using the Golden code, 3×3 and 4×4 configurations Accordingly, the signal set selected in second step described above is the sub-set corresponding to the divided sub-matrix of the equivalent channel matrix of maximum determinant of covariance matrix overall divided sub-matrices. Moreover, sufficient conditions on the characteristics of the sub-matrices of the equivalent channel matrix involving characteristics of the used Space-Time Block Code have been disclosed in L. P. Natarajan and B. S. Rajan. An Adaptive Conditional Zero-Forcing Decoder with Full-diversity, Least Complexity and Essentially-ML Performance for STBCs. In Information Theory and its Applications (ISITA), 2012 International Symposium on, pages 235-239, October 2012. One of these sufficient conditions imposes that, in order to achieve a full diversity order under ACZF or ACZF-SIC decoding, at least one of the L sub-matrices should be full rank.

Although existing sub-detection methods offer better performance than sub-optimal linear and non-linear joint decoding schemes, they do not allow to control the diversity order while achieving a reduced complexity.

SUMMARY

To address these and other problems, there is provided a decoder for decoding a signal received through a transmission channel in a communication system, the signal carrying information symbols selected from a given set of values and being associated with a signal vector, the transmission channel being represented by a channel matrix. The decoder comprises:

a sub-block division unit configured to divide the received signal vector into a set of sub-vectors in correspondence with a division of a matrix related to the channel matrix;

a candidate set estimation unit for recursively determining candidate estimates of sub-blocks of the transmitted signal corresponding to the sub-vectors, each estimate of a given sub-block being determined from at least one candidate estimate of the previously processed sub-blocks, the candidate set estimation unit being configured to determine a set of candidate estimates for at least one sub-block of the transmitted signal by applying at least one iteration of a decoding algorithm using the estimates determined for the previously processed sub-blocks, the number of candidate estimates determined for the sub-block being strictly inferior to the cardinal of the given set of values, the decoder further comprising a signal estimation unit for calculating an estimate of the transmitted signal from the candidate estimates determined for the sub-blocks.

In one embodiment, the decoder may be configured to previously determine an orthogonal matrix Q and an upper triangular matrix R by performing a QR decomposition from the channel matrix, and the sub-block division unit is configured to divide the upper triangular matrix R into a number of upper triangular sub-matrices and a number of rectangular matrices, the number of upper triangular sub-matrices being superior or equal to two, the sub-block division unit being configured to divide the received signal vector into a set of sub-vectors such that each sub-vector of the received signal vector corresponds to one of the upper triangular sub-matrices.

The decoder may be then provided to determine the received signal vector by multiplying the transpose matrix of the orthogonal matrix with the received signal.

In particular, the decoder may be further arranged to determine a set of permuted matrices from the channel matrix by permuting rows or columns of the channel matrix, and to perform a QR decomposition of each permuted matrix to determine intermediary upper triangular matrices, the decoder being configured to select one of the permuted matrices from a criterion related to the components of the intermediary upper triangular matrix obtained for each permuted matrix, the sub-block division unit being configured to divide the upper triangular matrix R corresponding to the intermediary upper triangular matrix associated with the selected permuted matrix.

In certain embodiments, the decoding algorithm may be a lattice decoding algorithm.

Particularly, the decoding algorithm may be configured to solve a condition on the cumulated metric of each block with respect to a threshold.

The decoding algorithm may be a sequential decoding algorithm, and the threshold is the cumulated metric threshold of the sequential decoding algorithm.

Alternatively, the decoding algorithm may be a sphere constrained decoding algorithm, and the threshold is the initial radius of the sphere of the sphere constrained decoding algorithm.

In one embodiment, the threshold may be determined from a target quality of service indicator.

The target quality of service indicator may be the target diversity order.

In particular, the decoder may further comprise a threshold estimation unit configured to determine a threshold for the decoding of each sub-block.

The threshold estimation unit may be configured to determine the threshold from the target diversity order and from at least one further parameter chosen among a group consisting of an estimate of the signal to noise ratio, the dimension of the received signal, and the dimension of said sub-block.

The threshold estimation unit may comprise a lookup table storing a value of the threshold for each tuple of values comprising the value of the target diversity order and the at least one further parameter.

In one embodiment, the number of sub-blocks may be equal to two and the threshold values of the look-up table may be predetermined from the probability that a selected path corresponding to the first sub-block be not visited during a tree search implemented by the decoding algorithm applied for the first sub-vector to determine the candidate estimates for the first sub-block and the signal-to-noise ratio.

The threshold estimation unit may be configured to update the lookup table depending on statistical data related to the decoding of at least one other signal. In certain embodiments, each set of candidate estimates may be a data structure ordered by increasing value of the cumulated metric obtained for each estimate.

The candidate set estimation unit may be further configured to further reduce the number of candidates determined in the current set of candidate estimates for the at least one sub-block depending on a target number of candidate estimates associated with the sub-block.

The target number of candidate estimates associated with the sub-block may be determined from the number of candidate estimates of the previously processed sub-block.

The target number of candidate estimates associated with the sub-block may be a multiplicative function of the number of candidate estimates of the previously processed sub-block, the multiplicative function having a slope coefficient inferior to one.

The candidate set estimation unit may further comprise determining one estimate for the last processed sub-block by applying an optimal or sub-optimal decoding algorithm selected according to a predefined criteria.

The optimal or sub-optimal decoding algorithm may be chosen among a group consisting of a ML decoding algorithm (optimal decoding algorithm), a ZF-DFE decoding algorithm, and a MMSE decoding algorithm (the ZF-DFE decoding algorithm and the MMSE decoding algorithms being sub-optimal decoding algorithms). The ML decoding algorithm may be in particular any optimal lattice decoding algorithm).

In certain embodiments, the signal estimation unit may be configured to determine the tuple of estimates that minimizes the global metric, each tuple estimate comprising one candidate estimate from each one of the sets of candidate estimates obtained for the sub-blocks of information symbols.

In one application of the invention, the communication system may be a coded system using a space-time block code to encode the data signals transmitted over the transmission channel, the decoder being configured to vectorize the signal vector using an equivalent channel matrix, and divide the equivalent channel matrix into a number of rectangular equivalent channel sub-matrices, each rectangular sub-matrix being a function of the Linear Dispersion Matrix representing the signal sent over the transmission channel corresponding to the received signal, the sub-block division unit comprising dividing the received signal vector into a set of sub-vectors in correspondence with the division of the equivalent channel matrix.

The decoder may be configured to reorder the rectangular sub-matrices depending on the value of the determinant of the product of the Hermitian transposition of each equivalent channel sub-matrix with the equivalent channel sub-matrix.

The invention also provides a receiver for receiving and decoding an encoded signal, the receiver comprises a decoder according to any of the preceding claim for decoding the signal.

A mobile device capable of transmitting and receiving data in a wireless communication network, the mobile device comprises such receiver for receiving a signal is also provided.

There is also provided a method of decoding a signal received through a transmission channel in a communication system, the signal carrying information symbols selected from a given set of values and being associated with a signal vector, the transmission channel being represented by a channel matrix, the method comprising:
  dividing the received signal vector into a set of sub-vectors in correspondence with a division of a matrix related to the channel matrix;
  recursively determining candidate estimates of sub-blocks of the transmitted signal corresponding to the sub-vectors, each estimate of a given sub-block being determined from at least one candidate estimate of the previously processed sub-blocks,
    the step of recursively determining estimates comprises, for at least one sub-block, determining a set of candidate estimates for the sub-block of the transmitted signal by applying at least one iteration of a decoding algorithm using the estimates determined for the previously processed sub-blocks, the number of candidate estimates determined for the sub-block being strictly inferior to the given set of values, the method further comprising calculating an estimate of the transmitted signal from the candidate estimates determined for the sub-blocks.

The method may further comprise:
  determining an orthogonal matrix Q and an upper triangular matrix R by performing a QR decomposition from the channel matrix;
  dividing the upper triangular matrix R into a number of upper triangular sub-matrices and a number of rectangular matrices, the number of upper triangular sub-matrices being superior or equal to two,
  the step of dividing the received signal vector into a set of sub-vectors comprising dividing each sub-vector of the received signal vector in correspondence with one of the upper triangular sub-matrices.

There is also provided a computer program product for decoding a signal received through a transmission channel in a communication system, the signal carrying information symbols selected from a given set of values and being associated with a signal vector, the transmission channel being represented by a channel matrix, the computer program product comprising:
  a non-transitory computer readable storage medium; and
  instructions stored on the non-transitory computer readable storage medium that, when executed by a processor, cause the processor to:
  divide the received signal vector into a set of sub-vectors in correspondence with a division of a matrix related to the channel matrix; and
  recursively determine candidate estimates of sub-blocks of the transmitted signal corresponding to the sub-vectors, each estimate of a given sub-block being determined from at least one candidate estimate of the previously processed sub-blocks,
  the processor is caused to determine a set of candidate estimates for at least one sub-block of the transmitted signal by applying at least one iteration of a decoding algorithm using the estimates determined for the previously processed sub-blocks, the number of candidate estimates determined for the sub-block being strictly inferior to the cardinal of the given set of values, the processor being further caused to calculate an estimate of the transmitted signal from the candidate estimates determined for the sub-blocks.

The various embodiments of the invention make it possible to avoid the conventional exhaustive search, while offering a flexibility on desired diversity order and a reduced complexity.

Further advantages of the present invention will become clear to the skilled person upon examination of the drawings and detailed description. It is intended that any additional advantages be incorporated herein.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

DETAILED DESCRIPTION

Figure 1:
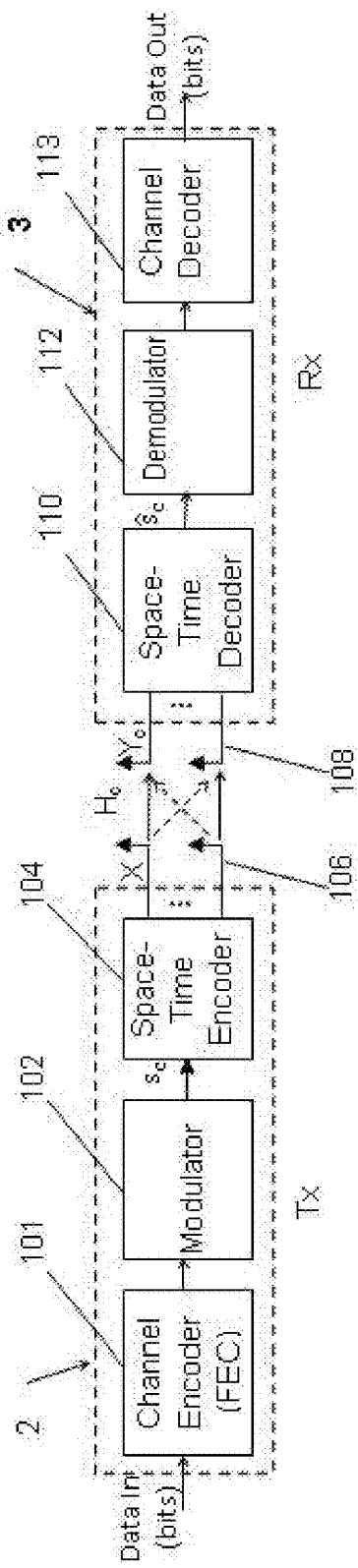
FIG. 1 schematically represents an exemplary communication system implementing the decoding method.

Embodiments of the invention provide a sub-block decoding method for decoding a received signal according to a semi-exhaustive and recursive approach. The sub-block decoding method and device according to the embodiments of the invention divide the information symbols contained in a received signal y in accordance with the division of a matrix related to the channel matrix $H_c$ which provides N groups of information symbols $s^{(k)}$ (also referred to hereinafter as "blocks of information symbols"), k ranging from N to 1. The signal carries information symbols selected from a given set of values. The set of values may be a finite and discrete set of values such as an alphabet, or alternatively an infinite set of values such as infinite lattices $Z^n$ of dimension n.

In one embodiment, the division of the information symbols contained in the received signal y is made in correspondence with a division of the upper triangular matrix obtained from a QR decomposition of the channel matrix H into $$N + \frac{N(N-1)}{2}$$

of sub-blocks, N being at least equal to two. The following description of certain embodiments will be made with reference to a generation of sub-blocks of information symbols from a division of the upper triangular matrix R, for illustration purposes.

The sub-block decoding method recursively decodes each sub-block of information symbols $s^{(k)}$, the decoding of at least one sub-block of information symbols $s^{(k)}$ comprising applying at least one iteration of a decoding algorithm $D_k$ using the sets of candidate estimates $\Gamma_{k+1}, \ldots, \Gamma_N$ determined for the previously processed sub-blocks $s^{(k+1)}, \ldots, s^{(N)}$ to determine a set of candidate estimate $\Gamma_k$ for the current sub-block of information symbols $s^{(k)}$, the number of candidate estimates $\mathcal{A}_k$ of the current candidate set $\Gamma_k$ being strictly inferior to the cardinal of the set of values from which are selected the information symbols (for example cardinal of the Alphabet). Each candidate estimate stored in a candidate set $\Gamma_k$ represents a vector of information symbols. The following description of certain embodiments will be made with reference to information symbols selected from a finite and integer set of values, such as an alphabet.

In particular, the decoding algorithm $D_k$ may be a lattice decoding algorithm. In one embodiment, the lattice decoding algorithm may be applied to solve a threshold condition on the cumulated metric $m(s^{(k)})$ corresponding to the sub-block $s^{(k)}$, each iteration of the lattice decoding algorithm corresponding to a candidate estimate.

In one embodiment, the threshold condition may be related to a threshold $R_{th_k}$ derived from a target QoS indicator $Q_{target}$, such as the target diversity order $d_{target}$. This ensures a better control of the target quality of service indicator while ensuring a reduced complexity.

The estimate of the signal ŝ may be then constructed from the estimates stored in the candidate sets $\Gamma_1, \ldots, \Gamma_N$, for example by selecting the tuple of values that minimizes the global metric $\Sigma_{k=1}^N m(s^{(k)})$, each value of the tuple corresponding to a value of one candidate set $\Gamma_i$.

By convention, in the following description of certain embodiments of the invention, the index of the first processed sub-block will be referred to as k=N and the index of the last processed sub-block will be will be referred to as k=1. According to this convention, the sub-block of information symbols $s^{(k)}$ are thus recursively processed from k=N to k=1 with k being decrementing for the processing of the next sub-block $s^{(k-1)}$ of information symbols.

In one embodiment of the invention, the decoding of the last sub-block of information $s^{(1)}$ may comprise determining only one estimate for the candidate set $\Gamma_1$ by applying a sub-optimal decoding algorithm $D_1$ depending on a predefined criterion (for example ML decoding criterion), such as for example a ZF-DFE decoding algorithm.

This provides a semi-exhaustive recursive block decoding of a received signal implementable in different types of systems, such as in wireless or optical communication systems, signal processing systems, cryptographic systems, and positioning systems, etc.

In one application of the invention to wireless communication systems, the communication system may comprise at least a transmitter for transmitting simultaneously a plurality of information symbols through a communication channel, and at least a receiver for receiving one or more of the symbols transmitted by the transmitter in the form of independent signals. The communication channel may be any linear AWGN (Additive White Gaussian Noise) channel or a multipath channel using single carrier or multi-carrier modulation types such as OFDM (Orthogonal Frequency-Division Multiplexing).

The MIMO system may present a centralized configuration where the transmit antennas are collocated at a same user. Alternatively, the MIMO system may be a distributed MIMO system (or multi-user MIMO) where the transmit antennas are distributed in the communication network and are located at different users. Such multi-user MIMO configurations may be used for example in mobile networks in the uplink communications applied for example in cellular 3G, 4G and LTE standards or in cooperative communications applied for example in ad-hoc networks (wireless sensor networks, machine-to-machine communications, internet of things . . . ). In such multi-user configurations, the communication system may further use, alone or in combination, any multiple access technique such as Time Division Multiple Access (TDMA), Frequency Division Multiple Access (FDMA), Code Division Multiple Access (CDMA), and Space-Division Multiple Access (SDMA).

The communication system may be alternatively a single-antenna multicarrier communication system using multicarrier communication techniques to combat frequency-selective channels and manage interference and delays such as OFDM modulations adopted in wireless standards like IEEE 802.11 (WiFi) and Filter Bank Multi-Carrier (FBMC) modulations.

In other applications of the invention, the communication system may be an optical fiber-based communication system such as a Polarization Division Multiplexing-OFDM (PDM-OFDM) system used for example as a telecommunication medium in access networks, metropolitan networks, or in computer networks in order to generate, the optical communication channel output admitting a linear (lattice) representation. In such embodiments, the information symbols conveyed by an optical transmitter device may be carried by optical signals polarized according to the different polarization states of the fiber. The optical signals may propagate along the fiber-based transmission channel according to one or more propagation modes until reaching the optical receiver device.

In some embodiments corresponding to optical communications, the optical signal carrying the information symbols may be generated using a single wavelength lasers.

In other embodiments, wavelength division multiplexing (WDM) techniques may be used at the optical transmitter devices to enable generating optical signals using a plurality of independent wavelengths.

In another application of the invention to optical communications using in particular multi-mode fibers, space division multiplexing techniques may be further used to multiplex the information symbols according to the various propagation modes.

Further, a multiple access technique such as WDMA (Wavelength Division Multiple Access) may be used in applications to optical communication systems.

The wireless network environment may comprise a plurality of wireless or optical devices capable of operating in a wireless or optical environment, such as for example base stations, user equipment, terminals, each wireless or optical device including a transmitter and/or a receiver including one or more antennas, each wireless or optical device communicating with other wireless or optical devices through a wireless or optical connection.

When applied to MIMO decoding, for a single user or multiple users detection, the dimension of the received signal or channel output depends on the dimension of the signal space at the transmitter, on the number ($n_t$) of the Transmit (Tx) antennas and/or on the number ($n_r$) of Receive (Rx) antennas.

Referring to FIG. 1, an exemplary wireless communication system 100 between a transmitter and a receiver in which a MIMO transmission is used, implementing an STBC (Space Time Block Code) code in transmission to distribute the symbols modulated over various degrees of freedom of the channel. FIG. 1 will be described with reference to communicating base stations, for illustration purpose only although the skilled person will readily understand that other type of wireless devices may be used. Each transmitter 2 of a station may exchange data with a receiver 3 of another station according to the wireless communication system. The wireless network 100 may rely on a centralized architecture (a controller is provided to control the operation of the base stations) or a decentralized architecture (the base stations may communicate directly with one another). User Terminals (such as wireless devices, cellular phones, personal digital assistants, laptops, robots, Internet of Thing devices, etc.), may communicate with one or more base stations on the forward link or on the reverse links. The user terminals may be fixed or mobile.

The MIMO configuration may be symmetric, in which case it includes a same number ($n_t$) of Transmit antennas as the number ($n_r$) of Receive antennas. Alternatively, the MIMO configuration may be asymmetric, in which case the number ($n_t$) of Transmit antennas is different from the number ($n_r$) of Receive antennas (in particular the number $n_r$, at the receive side, is higher than $n_t$, at the transmit side to avoid a rank deficiency).

The transmitter 2 can transmit a signal to a receiver 3 by means of a noisy MIMO channel. The data transmitter 2 can in particular be integrated in the base stations. The transmitter 2 may comprise for example:
- a channel coder 101 for providing convolutional codes,
- a modulator 102 such as a QAM modulator for delivering symbols;
- a space/time coder 103 for delivering a code word;
- $n_t$ transmission antennas 106, each transmission antenna being associated with an OFDM modulator.

The transmitter 2 codes a binary signal received as input using a convolutional code provided by the channel coder 101. The signal may be modulated by the modulator 102 according to a modulation scheme (for example, a quadrature amplitude modulation nQAM). The modulator 102 can also implement a modulation scheme generating complex symbols $s_c$, each complex symbol belonging to a group of symbols $s_i$. The modulated symbols thus obtained may be then coded by the space-time coder 104 to form a code word STBC, such as the Golden Code ("The Golden Code: A 2×2 Full-Rate Space-Time Code with Non-Vanishing Determinants", J.-C. Belfiore, G. Rekaya, E. Viterbo, IEEE Transactions on Information Theory, vol. 51, no. 4, pages 1432-1436, April 2005). The STBC code may be based on a complex matrix of dimension $n_t*T$, in which $n_t$ designates the number of transmission antennas and T is the time length of the STBC code, or on a spatial multiplexing (the modulated symbols are directly sent to the transmission antennas).

The code word thus generated is converted from the time domain to the frequency domain (noted X in FIG. 1) and distributed over the $n_t$ transmission antennas. Each dedicated signal is then modulated by a respective OFDM modulator, and transmitted over the corresponding transmission antenna 109, optionally after filtering, frequency transposition and amplification.

The receiver 3 can be also integrated in the base stations. The receiver 3 may be configured to receive a signal Yc transmitted by the transmitter 2 in a wireless channel. The channel may be noisy (for example channel with Additive White Gaussian Noise (AWGN) subjected to fading). The signal transmitted by the transmitter 2 may be further affected by echoes due to the multiple paths and/or the Doppler effect due to the transmitter and receiver having a non-zero relative velocity.

In one exemplary embodiment, the receiver 3 may comprise:
- $n_r$ receiving antennas 108 for receiving the signal y, each receiving antenna being associated with a respective OFDM demodulator; the OFDM demodulators ($n_r$ demodulators) are configured to demodulate the received signal observed at each receiving antenna and delivering demodulated signals. A frequency/time converter may be used to perform a reverse operation of the time/frequency conversion implemented in transmission, and to deliver a signal in the frequency domain;

a space/time decoder 110 configured to deliver a decoded signals according to a sub-block decoding approach, according to the embodiments of the present invention;

a demodulator 112 configured to perform a demodulation associated with a decoding.

It should be noted that the receiver 3 implements a reverse processing of the processing implemented in transmission. Accordingly, if a single-carrier modulation is implemented in transmission instead of a multi-carrier modulation, the $n_r$ OFDM demodulators are replaced by corresponding single-carrier demodulators.

The skilled person will readily understand that the various embodiments of the invention are not limited to specific applications. Exemplary applications of this new decoder include, with no limitation, multi-user communication systems, MIMO decoding in configurations implementable in wireless standards such as the WiFi (IEEE 802.11n), the cellular WiMax (IEEE 802.16e), the cooperative WiMax (IEEE 802.16j), the Long Term Evolution (LTE), the LTE-advanced, the 5G ongoing standardization, and optical communications.

Further the semi-exhaustive decoding method and device according to the various embodiments of the invention may be applied to both coded and uncoded systems. A coded communication system uses a space-time block code (STBC) to encode the digital data sequence at the transmitter side, the signal sent over the transmission channel comprising a set of independent symbols, the space-time block code being represented by a generator matrix G. In an uncoded communication system, the generator matrix is equal to the Identity matrix.

In one application of the invention to a Rayleigh fading wireless multi-antenna system to decode a signal received by the multi-antenna system (MIMO), with $n_t$ transmit and $n_r$ receive antennas using spatial multiplexing, the data signal $y_c$ received as a complex-valued vector, according to a complex-valued representation of the channel output is given by:

$$y_c = H_c s_c + w_c \quad (1)$$

In Equation (1), $H_c \in \mathbb{C}^{n_r \times n_t}$ designates the complex value of the channel matrix H of elements drawn according to the distribution $\mathcal{N}(0,1)$, $s_c$ designates the complex value of the vector s representing the transmitted data signal vector and $w_c \in \mathbb{C}^{n_r}$ designates the complex value of the additive white Gaussian noise vector w. The received signal $y_c$ may be then transformed into a real-valued representation, for example according to equation (2):

$$y = \begin{bmatrix} \mathcal{R}(H_c) & -\mathcal{J}(H_c) \\ \mathcal{J}(H_c) & \mathcal{R}(H_c) \end{bmatrix} \begin{bmatrix} \mathcal{R}(s_c) \\ \mathcal{J}(s_c) \end{bmatrix} + \begin{bmatrix} \mathcal{R}(w_c) \\ \mathcal{J}(w_c) \end{bmatrix} \quad (2)$$

In equation (2), $\mathcal{R}(.)$ and $\mathcal{J}(.)$ denote respectively the real and imaginary parts of a complex-valued input (vector or matrix).

The equivalent channel output can then be written as:

$$y = Hs + w \quad (3)$$

In embodiments where a length-T Space-Time code is used, the channel output can be written in the same form of equation (3) with the equivalent channel matrix $H_{eq}$ given by:

$$H_{eq} = H_c \Phi \quad (4)$$

In equation (4), $\Phi \in \mathbb{C}^{n_t T \times n_t T}$ corresponds to the coding matrix of the underlying code. For ease of presentation and given that both uncoded and coded schemes result in a same real-valued lattice representation, the following description will be made with reference to the spatial multiplexing and symmetric case with $n_t = n_r$ and $n = 2n_t$.

According to the equivalent system obtained in (3), the received signal can be viewed as a point of the lattice generated by H and perturbed by the noise vector w.

When optimal detection is required, the receiver implements an ML decoder that attempts to determine, given the channel output and the channel matrix, an estimate $\hat{s}$ of the originally transmitted symbols vector from the given data in H and y, according to the minimization of the error probability such that:

$$\hat{s} = \mathrm{argmin}_{s \in \mathcal{A}^n} P_r(\hat{s} \neq s) \quad (5)$$

In Equation (5), the finite subset $\mathcal{A}$ represents the alphabet to which belong the real and imaginary parts of the information symbols. For example, using an $2^M$-ary QAM constellation to construct the complex information symbols, the alphabet is the integer sub-set given by $\mathcal{A} = [-(M-1), (M-1)]$ ($\mathcal{A}$ may represent for example a M-ary QAM constellation to which belongs the complex information symbol). The minimization of the error probability under ML detection is equivalent to the minimization problem given by:

$$\hat{s} = \mathrm{argmin}_{s \in \mathcal{A}^n} \|y - Hs\|^2 \quad (6)$$

Assuming coherent system where H is perfectly known or estimated at the receiver using estimation techniques such as least square estimators, optimal ML detection reduces to solve a closest vector problem in the n-dimensional lattice generated by H to seek the nearest lattice point to the equivalent received signal y according to the minimization problem of Equation 6.

Thus the ML detector (equivalently ML decoder) chooses the symbols vector s which yields the smallest Euclidean distance between the received vector y, and hypothesized message Hs. The ML detector represents a discrete optimization problem over candidate vectors s within the chosen alphabet. In the case of high constellations size and high dimension of the system (number of antennas), the search for the ML solution in an exhaustive way generally requires a very high complexity.

Sequential decoders implementing a tree search strategy searches the closest lattice point to the received vector using a decoding tree structure. Before transmission of the signal to such a sequential decoder, a predecoding may be performed using a QR decomposition of the channel matrix such that H=QR where Q designates an orthogonal matrix and R designates an upper triangular matrix. Given the orthogonality of Q, equation (3) can be rewritten in the following form:

$$\tilde{y} = Q^t y = Rs + Q^t w \quad (7),$$

By denoting $\tilde{w} = Q^t w$, equation (7) can be rewritten:

$$\tilde{y} = Rs + \tilde{w} \quad (8)$$

The ML decoding problem then amounts to solving the equivalent system given by:

$$\hat{s} = \mathrm{argmin}_{s \in \mathcal{A}^n} \|\tilde{y} - Rs\|^2 \quad (9)$$

The triangular structure of R thus reduces the search of the closest point to a sequential tree-search. Nodes in the tree represent the different possible values of the symbols $s_i$.

Figure 2:
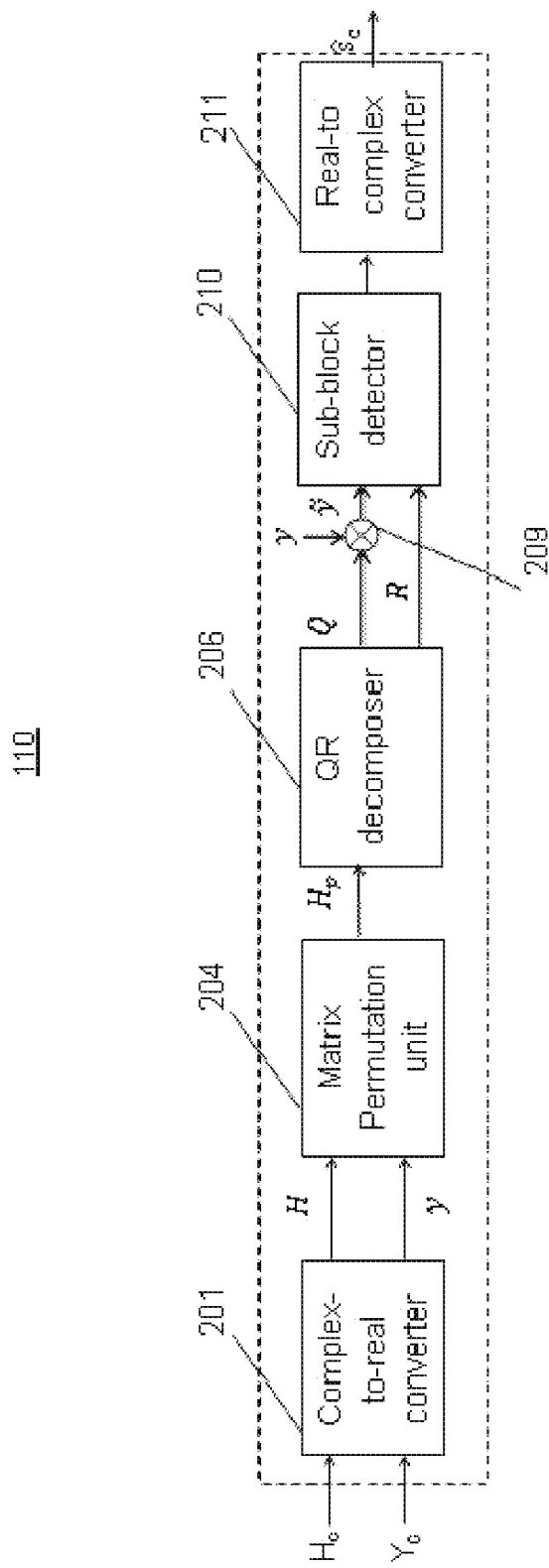
FIG. 2 is a block diagram representing a Space-Time decoding device according to an exemplary embodiment of the present invention.

FIG. 2 is a block diagram representing the Space Time decoder 110 according to certain embodiments.

The decoder 110 may comprise a complex-to-real converter 201 to transform the received signal $y_c$ into a real-valued representation, and a QR decomposition unit 206 for performing a QR decomposition of the channel matrix such that H=QR where Q designates the orthogonal matrix and R designates the upper triangular matrix. The decoder 110 may further comprise a modifier unit 209 to rewrite the received signal vector y into an equivalent received signal vector $\tilde{y}$=Rs+$Q^t$w and a sub-block detector (also referred to as sub-block decoder) 210 configured to recursively detect in blocks the received signal from a division of the equivalent received signal vector $\tilde{y}$ performed from a corresponding division of the upper triangular matrix R. In certain embodiments, the decoder 110 may also comprise a channel matrix permutation unit 204 to permute columns or lines of the channel matrix H prior to the QR decomposition.

The Space-Time decoder 110 may further comprise a real-to-complex convertor 211 configured to deliver an estimate of the complex-valued transmitted signal by converting the real-valued vector ŝ into a complex-valued vector $\hat{s}_c$. The conversion operation is the invert of the processing performed at the complex-to-real converter 201.

Figure 3:
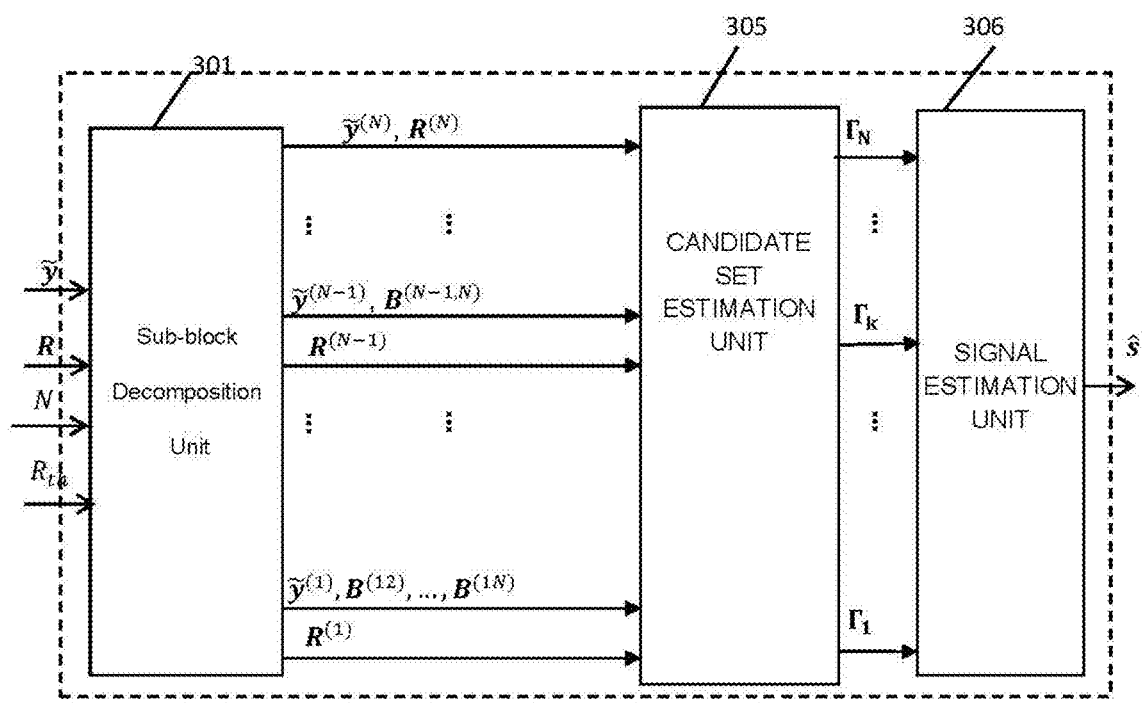
FIG. 3 is a block diagram representing a sub-block detection device according to an exemplary embodiment of the present invention.

Referring to FIG. 3, there is shown a schematic representation of the sub-block detector 210, according to certain embodiments.

The sub-block decoder 210 may comprise a sub-blocks decomposition unit 301 (also referred to as a "sub-block division unit") configured to:

- decompose the equivalent received vector $\tilde{y}$ into N sub-vectors $\tilde{y}^{(k)}$;
- divide the upper triangular matrix R into sub-matrices in correspondence with the division of the received signal vector.

In particular, the upper triangular matrix R may be divided into N upper triangular sub-matrices $R^{(k)}$, k=1, ..., N and $$\frac{N(N-1)}{2}$$

rectangular sub-matrices $B^{(kj)}$, k=1, ..., N; j=k+1, ..., N.

Accordingly, the vector $\tilde{y}$ is divided into N sub-vectors $\tilde{y}^{(k)}$, k=1, ..., N of lengths $l_k$ such that $$\tilde{y} = \begin{bmatrix} \tilde{y}^{(1)} \\ \vdots \\ \tilde{y}^{(N)} \end{bmatrix}$$

and $\Sigma_{k=1}^{N} l_k$=n. The same vector division is applied to the vector of symbols s to obtain N sub-vectors $s^{(k)}$, k=1, ..., N of lengths $l_k$ such that $$s = \begin{bmatrix} s^{(1)} \\ \vdots \\ s^{(N)} \end{bmatrix}.$$

The upper triangular matrix R is thus divided into $$N + \frac{N(N-1)}{2}$$

matrices composed of N upper triangular sub-matrices $R^{(k)}$, k=1, ..., N and $$\frac{N(N-1)}{2}$$

rectangular sub-matrices $B^{(jk)}$, k=1, ..., N; j=k+1, ..., N such that:

$$R = \begin{bmatrix} R^{(1)} & \cdots & B^{(1,N-1)} & B^{(1N)} \\ 0 & \cdots & \vdots & \vdots \\ 0 & 0 & R^{(N-1)} & B^{(N-1,N)} \\ 0 & 0 & 0 & R^{(N)} \end{bmatrix} \quad (10)$$

Each upper triangular sub-matrix $R^{(k)}$, k=1, ..., N represents a square matrix of dimension $l_k \times l_k$ and corresponds to the sub-vector $\tilde{y}^{(k)}$, k=1, ..., N. Further, each sub-matrix $B^{(jk)}$, k=1, ..., N; j=k+1, ..., N represents a rectangular matrix of dimension $l_k \times l_j$ and corresponds to a feedback matrix from block j to block k.

Accordingly, (8) can be rewritten as:

$$\begin{bmatrix} \tilde{y}^{(1)} \\ \vdots \\ \vdots \\ \tilde{y}^{(N)} \end{bmatrix} = \begin{bmatrix} R^{(1)} & \cdots & B^{(1,N-1)} & B^{(1N)} \\ 0 & \cdots & \vdots & \vdots \\ 0 & 0 & R^{(N-1)} & B^{(N-1,N)} \\ 0 & 0 & 0 & R^{(N)} \end{bmatrix} \cdot \begin{bmatrix} s^{(1)} \\ \vdots \\ \vdots \\ s^{(N)} \end{bmatrix} + \begin{bmatrix} \tilde{w}^{(1)} \\ \vdots \\ \vdots \\ \tilde{w}^{(N)} \end{bmatrix} \quad (11)$$

The ML decoding problem of equation (9) can thus be rewritten as:

$$\hat{s} = \text{n}_{s \in \mathcal{A}^n} \|\tilde{y} - Rs\|^2 = \text{argmin}_{s^{(k)} \in \mathcal{A}^{l_k}} \|\Sigma_{k=1}^{N} \tilde{y}^{(k)} - (R^{(k)} s^{(k)} + \Sigma_{j=k+1}^{N} B^{(kj)} s^{(j)})\|^2 \quad (12)$$

For example, considering a number of blocks N=2, the R matrix can be divided as follows:

$$R = \begin{bmatrix} R^{(1)} & B \\ 0 & R^{(2)} \end{bmatrix} \quad (13)$$

In the above example of a two block division of the upper triangular matrix R:

- $R^{(1)}$ is an upper triangular sub-matrix of size (n−p)×(n−p) with real components ($R^{(2)} \in \mathbb{R}^{(n-p) \times (n-p)}$), with n designating the dimension of the equivalent received signal,
- $R^{(2)}$ is an upper triangular sub-matrix of size p×p with real components ($R^{(1)} \in \mathbb{R}^{p \times p}$);
- B designates a rectangular sub-matrix of size (n−p)×p with real components ($R^{(2)} \in \mathbb{R}^{(n-p) \times p}$).

Accordingly, the corresponding symbol vectors are $s^{(2)}$ and $s^{(1)}$ of size p and n−p respectively:

$$\begin{bmatrix} \tilde{y}^{(1)} \\ \tilde{y}^{(2)} \end{bmatrix} = \begin{bmatrix} R^{(1)} & B \\ 0 & R^{(2)} \end{bmatrix} \cdot \begin{bmatrix} s^{(1)} \\ s^{(2)} \end{bmatrix} + \begin{bmatrix} \tilde{w}^{(1)} \\ \tilde{w}^{(2)} \end{bmatrix} \quad (14)$$

Equation (12) applied to such exemplary two-block sub-decoding can be written:

$$\hat{s} = \underset{s^{(2)}, s^{(1)} \in \mathcal{A}^p \times \mathcal{A}^{n-p}}{\operatorname{argmin}} \left( \| \tilde{y}^{(1)} - R^{(1)} s^{(1)} - B s^{(2)} + \tilde{y}^{(2)} - R^{(2)} s^{(2)} \|^2 \right)$$

This problem may be solved using the following approximation:

$$\hat{s} = \operatorname{argmin}_{s^{(2)}, s^{(1)} \in \mathcal{A}^p \times \mathcal{A}^{n-p}} \left( \| \tilde{y}^{(1)} - R^{(1)} s^{(1)} - B s^{(2)} \|^2 + \| \tilde{y}^{(2)} - R^{(2)} s^{(2)} \|^2 \right) \quad (15)$$

It should be noted that the division corresponding to equation (15) may generate sub-optimalities in the decoding results such that the resolution of equation (15) may not correspond to the ML global solution.

The sub-blocks detector 210 may further comprise at least one candidate set estimation unit 305 for determining the set of candidate estimates $\Gamma_k$ for each block $s^{(k)}$ and a symbol estimation unit 306 for determining an estimate ŝ of the equivalent transmitted signal from the data sets $\Gamma_1, \ldots, \Gamma_N$.

Figure 4:
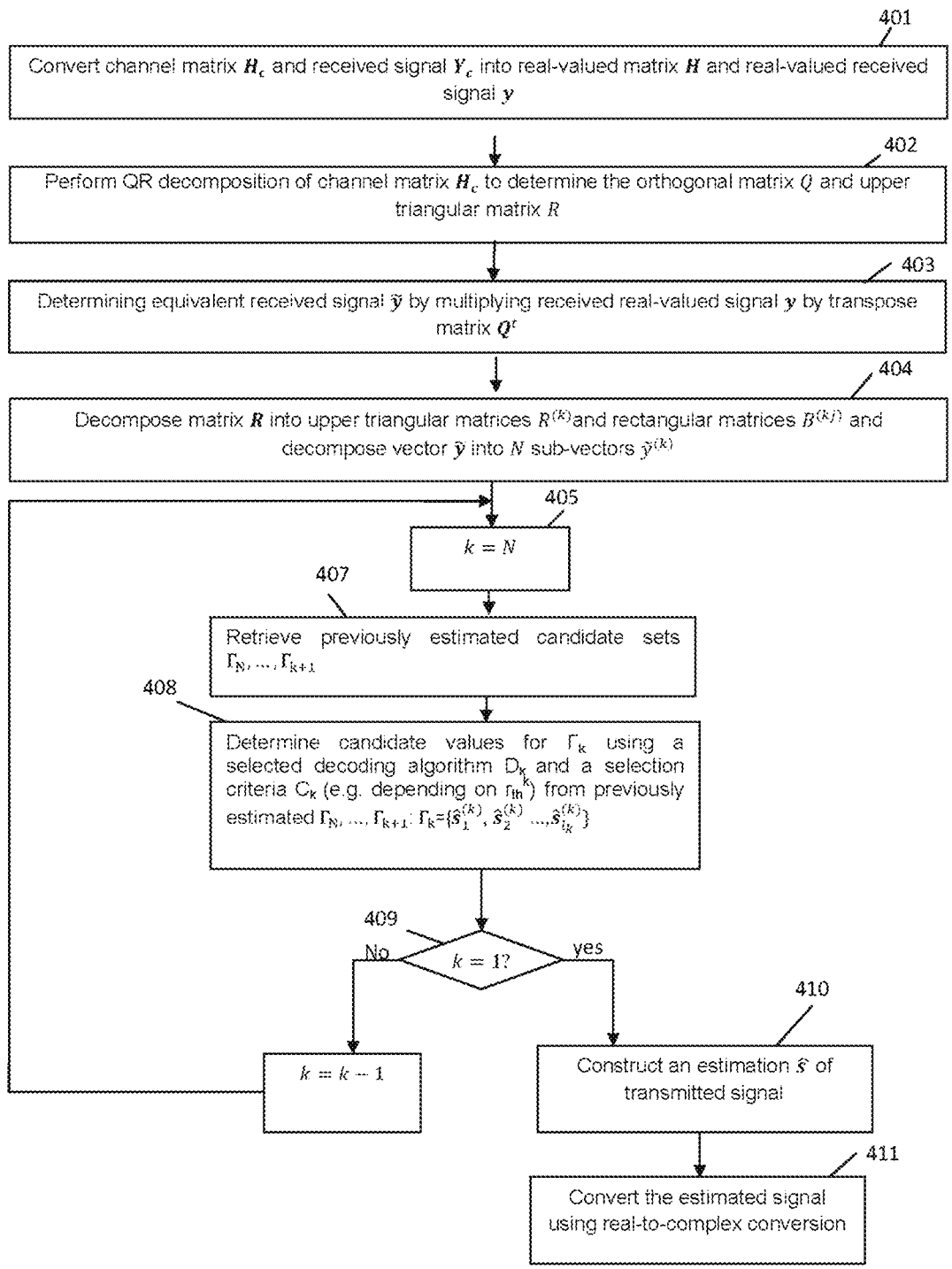
FIG. 4 is a flowchart depicting the decoding method according to certain embodiments.

Referring now to FIG. 4, a flowchart is presented that depicts a sub-block decoding method which may be executed by the receiver 3 to decode a received signal y, according to certain embodiments.

In step 401, the channel matrix $H_c$ and the received signal $Y_c$ may be converted into real-valued matrix H and real-valued received signal y.

In step 402, the QR decomposition of the channel matrix $H_c$ is performed to determine the orthogonal matrix Q and upper triangular matrix R. In certain embodiments, the channel matrix $H_c$ may be permuted prior to performing the QR decomposition using any permutation technique comprising a multiplication of the channel matrix $H_c$ with a permutation matrix. Alternatively, the upper triangular matrix R obtained from the QR decomposition may be sorted according to other ordering methods.

In step 403, the equivalent received signal $\tilde{y}$ is determined by multiplying the received real-valued signal y by the transpose matrix $Q^t$.

In step 404, the matrix R is divided into N upper triangular matrices $R^{(k)}$, k=1, ..., N and $$\frac{N(N-1)}{2}$$

rectangular matrices $B^{(kj)}$, k=1, ..., N; j=k, ..., N and the equivalent signal vector $\tilde{y}$ is divided into N sub-vectors $\tilde{y}^{(k)}$. The same vector division is applied to the vector of symbols s to obtain N sub-vectors $s^{(k)}$, k=1, ..., N of lengths $l_k$ such that $$s = \begin{bmatrix} s^{(1)} \\ \vdots \\ s^{(N)} \end{bmatrix}.$$

The decoding method proceeds a number of iterations of the steps 407 to 408 depending on the number of sub-blocks $s^{(k)}$ starting from k=N, N corresponding to the number of sub-blocks (step 405) for determining each candidate set $\Gamma_k$ associated with each sub-block $s^{(k)}$.

More specifically, in step 407, if K≠N, the previously estimated candidate sets $\Gamma_N, \ldots, \Gamma_{k+1}$ are retrieved from memory.

In step 408, the candidate estimates for $\Gamma_k$ are then determined using a number of iterations of a given decoding algorithm $D_k$ solving a condition related to the cumulated metric $m(s^{(k)})$ for the k-th block $s^{(k)}$ the condition further depending on the previously estimated candidate sets $\Gamma_N, \ldots, \Gamma_{k+1}$ if k≠N. The candidate set $\Gamma_k$ thus comprises $A_k$ values $\{\hat{s}_1^{(k)}, \hat{s}_2^{(k)}, \ldots, \hat{s}_{A_k}^{(k)}\}$, each estimate corresponding to an iteration of the lattice decoding algorithm. Each estimate stored in a candidate set $\Gamma_k$ represents a vector of symbols. The candidate estimates in the candidate set $\Gamma_k$ are generated such that the number of candidate estimates in the candidate set $\Gamma_k$ is strictly inferior to the cardinal of the set of values from which the information symbol are generated (such as an Alphabet).

For example, the candidate estimates may be determined using a set of iterations of a lattice decoding algorithm $D_k$ enumerating the ML solution (corresponding to the point minimizing the cumulated metric $m(s^{(k)})$), and a set of neighbors satisfying a selection criterion $C_k$, which provides the remaining candidate estimates. Each candidate set $\Gamma_k$ may be a list ordered by increasing value of the cumulated metric the ML solution corresponds to $\hat{s}_1^{(k)}$, and the neighbors correspond to $\{\hat{s}_2^{(k)}, \ldots, \hat{s}_{l_k}^{(k)}\}$.

As used herein, the cumulated metric $m(s^{(k)})$ for a k-th block $s^{(k)}$ is defined as:

$$m(s^{(k)}) = \| \tilde{y}^{(k)} - (R^{(k)} s^{(k)} + \Sigma_{j=k+1}^{N} B^{(kj)} \hat{s}^{(j)}) \|^2 \quad (16)$$

The terms $B^{(kj)} \hat{s}^{(j)}$ correspond to inter-symbol interference, the terms $B^{(kj)} \hat{s}^{(j)}$ for j=k+1 to N being known from previous estimations of $\Gamma_1, \ldots, \Gamma_N$ if k≠N.

By setting $\overline{y}^{(k)} = \tilde{y}^{(k)} - \Sigma_{j=k+1}^{N} B^{(kj)} \hat{s}^{(k)}$, the cumulated metric may be rewritten as:

$$m(s^{(k)}) = \| \overline{y}^k - R^{(k)} s^{(k)} \|^2 \quad (17)$$

In certain embodiments, the lattice decoding algorithm is configured to provide a solution to the following condition related to the cumulated metric, at each iteration:

$$m(s^{(k)}) \leq Rth_k \quad (18)$$

In condition (18), $Rth_k$ designates a threshold defined for each block $s^{(k)}$.

A new iteration of steps 407 and 408 may be performed for k=k-1 if k≠1, to determine candidate estimates for $\Gamma_{k-1}$ similarly.

If k=1, one or more candidate estimates may be determined for the last candidate set $\Gamma_1$ using a selected decoding algorithm $D_1$ using the previously estimated candidate sets $\Gamma_N, \ldots, \Gamma_2$. In one embodiment, only one candidate estimate may be determined for the last candidate set $\Gamma_1$ using a selected decoding algorithm $D_1$ such as an ML or ZF-DFE or MMSE and a selection criterion $C_1$. The candidate set $\Gamma_1$ thus comprises one value $\{\hat{s}_1^{(1)}\}$. The selection criterion $C_1$ may be related to the metric minimization and may be used to select the decoding algorithm $D_1$. For example, if the selection criterion $C_1$ consists in selecting the point that minimizes the metric, an ML decoding algorithm may be applied. Otherwise, if the selection criterion $C_1$ consists in selecting a neighbor point of the ML point, a sub-optimal decoding such as ZF-DFE or MMSE may be applied at this late iteration.

In certain embodiments, the selection criterion $C_1$ may depend on the zero-structure of the upper triangular matrix R or the orthogonality of the upper triangular matrix R. For example, if the upper triangular matrix R is orthogonal, a ZF (Zero-Forcing) decoding is sufficient to generate the ML solution.

In step 410, an estimation ŝ of equivalent transmitted signal is constructed from the candidate sets $\Gamma_N, \ldots, \Gamma_2, \Gamma_1$. In one embodiment, an estimation ŝ is constructed by determining the tuple $\{\hat{s}_{i_1}^{(1)}, \hat{s}_{i_2}^{(2)}, \ldots, \hat{s}_{i_N}^{(N)}\}$ which minimizes the global metric $\Sigma_{k=1}^{2N} \|m(s^{(k)})\|^2$.

In step 411, the real-valued vector ŝ may be converted into a complex-valued vector $\hat{s}_c$ to deliver an estimate of the complex-valued transmitted signal.

The lattice decoding algorithm $D_k$ used to estimate each candidate set $\Gamma_k$ in step 408 may be any type of lattice decoding algorithm capable of solving the condition (10) such as:

- A ML decoding algorithm based on the "Maximum Likelihood" decoding problem (also called "ML" decoding) to estimate the closest vector to the observed received signal under the minimization of a Euclidean distance criterion, such as an ML decoding method based on an exhaustive search over all the possible values in the constellation alphabet;
- a decoding method based on a Best-First tree search which uses a tree representation of the ML optimization problem (decoding tree) and only explores the paths having smallest weights than a predefined weight constraint, such as sequential, stack or SB-stack decoding algorithms (the SB-stack refers to the Spherical-Bound Stack decoder introduced in the article by G. R. Ben-Othman, R. Ouertani, and A. Salah, entitled "The Spherical Bound Stack Decoder", In Proceedings of International Conference on Wireless and Mobile Computing, pages 322-327, October 2008). Starting from the root node, the decoding algorithm explores all child nodes and keeps only the nodes having the weights that satisfy the constraint by storing them in a stack. The child nodes of the top node in the stack are then generated and their cumulated weights are computed. The explored nodes are searched according to their weights and only the nodes with the least cumulated weights are kept. The search is continued until finding a leaf node and the optimal path s returned.
- a decoding method based on a depth-First tree search, such as Sphere constrained Decoders and Schnorr-Euchner decoders, which uses a tree representation of the ML optimization problem (decoding tree) and, starting from the root node of the decoding tree, explores the first child node $s_n$, then its nearest child node $s_{n-1}$, and so on until reaching a leaf node $s_1$. Given this first path found, the search proceeds by returning back to the level 2 in the tree and explores the neighbor of the already explored node $s_2$. After finding all the possible paths and computing their relative cumulated weights, the shortest path is output.

Particularly, if the decoding algorithm is based on a sphere constrained decoding algorithm, the threshold $Rth_k$ corresponds to the initial radius of the sphere. If the decoding algorithm is a stack algorithm, the threshold $Rth_k$ may correspond to the limiting threshold of cumulated weight associated to nodes stored in the stack, or to the size of the second stack used to store the number of candidate points if the stack decoder uses a second stack. If the lattice decoding algorithm is an SB-stack decoder, the threshold $Rth_k$ may alternatively correspond to the sphere radius.

For example, for N=2, the decoding method may comprise only one iteration of step 408 using one or more iterations of a sphere constrained decoding algorithm, the threshold $R_{th_k}$ being the minimum search sphere radius. The candidate set $\Gamma_2$ thus only comprises lattice points lying inside the determined sphere radius. The near-ML solution lying inside the sphere of radius $R_{th_k}$ may be generated and stored to be expanded in the next iteration of the decoding steps for candidate set $\Gamma_1$, which consists in finding a remaining part of one of the branches previously generated using any type of decoding algorithm such as ML decoding.

In one exemplary application of the invention to a division of the received signal into two blocks $s^{(2)}$ and $s^{(1)}$, of length p and n−p respectively, step 408 may comprise applying a stack decoding algorithm $D_2$ to determine the candidate set $\Gamma_2$. The stack decoder originally generates the ML solution of the ML decoding given the system $y_2 = R^{(2)} s^{(2)} + w^{(2)}$ and stores the first point in a second stack to store candidate lattice points. The stack decoding algorithm proceeds recursively with the search for its $(A_2 - 1)$ metric-wise neighbors and save them in the second stack. The second stack thus provides the potential candidates for the candidate set $\Gamma_2$. The stack decoding algorithm is described for example in A. Salah, G. Othman, R. Ouertani, and S. Guillouard. New soft stack decoder for mimo channel. In Signals, Systems and Computers, 2008 42nd Asilomar Conference on, pages 1754-1758, October 2008.

In another exemplary application of the invention to a division of the received signal into two blocks $s^{(2)}$ and $s^{(1)}$, of length p and n−p respectively, step 408 may comprise applying a SB-stack decoding algorithm $D_2$ to determine the candidate set $\Gamma_2$. The SB-stack decoder is a reduced-complexity version of stack decoder. The threshold $R_{th_k}$ corresponds to the initial radius r centered on the received vector used to find, with a high probability, at least one lattice point including the ML solution. This radius may be determined to find, with a high probability a set of $A_2$ lattice points which are the ML solution and its $(A_2 - 1)$ metric-wise neighbors. By denoting $N_p$ ($N_p = A_2$) the number of lattice points contained in the sphere of radius (R2 is the generator matrix of $\Lambda$), the initial radius r ($r = R_{th_k}$) satisfies:

$$r \approx \left( \frac{N_p \times vol(\Lambda)}{V_p} \right)^{\frac{1}{p}} \quad (19)$$

In equation 19, $vol(\Lambda) = det(R_2)$ and $V_p$ designates the volume of a unit radius sphere in the real space $\mathbb{R}^p$, $$V_p = \frac{\Pi^{\frac{p}{2}}}{\frac{p}{2}!}.$$

This radius guarantees to find $N_p$ lattice points only for high values of $N_p$.

Alternatively, by using an effective number $N_e$ of points inside the sphere derived based on the shape of the used constellation and a multiplicative constellation-dependent factor $\alpha_\mathcal{A}$ (for example, $\alpha_{4QAM} = 3/2$, $\alpha_{16QAM} = 4$ and $\alpha_{64QAM} = 3/8$), the effective number of lattice points in the list is related to the radius of the sphere as follows:

$$r \approx \beta \times \alpha_{\mathcal{A}} \times \left( \frac{N_p \times vol(\Lambda)}{V_p} \right)^{\frac{1}{p}} \quad (20)$$

In equation 20, β designates an additional factor ensuring we find the needed $N_p$ lattice points inside the sphere.

In still another exemplary application of the invention to a division of the received signal into two blocks $s^{(2)}$ and $s^{(1)}$, of length p and n−p respectively, step 408 may comprise applying a sphere constrained decoding algorithm $D_2$ to determine the candidate set $\Gamma_2$. To get the $A_2$ lattice points, the algorithm, centered on the received vector runs first time to find the ML vector within the sphere radius r. Then, centered on this solution, the algorithm restarts to find its $A_2$−1 neighbors.

Alternatively, step 408 may comprise further reducing the number of candidates to be maintained in each candidate set $\Gamma_k$ based on the empirical and or statistical data. In embodiments where each candidate set $\Gamma_k$ is ordered by increasing value of the cumulated metric, such statistical data may be determined from the occurrence of each candidate value rank over previous decoding of data streams.

Alternatively, the threshold per block $R_{th_k}$ may be updated based on such statistical data to limit the number of candidates generated in each candidate set $\Gamma_k$.

In another embodiment, step 408 may comprise for each sub-block $s^{(k)}$:
  predetermining a target number of candidate estimate $A_k$ to be maintained in the candidate set $\Gamma_k$ as a function the number of candidate $A_{k+1}$ of the previous candidate set $\Gamma_{k+1}$ (for example a linear or multiplicative function of the type $A_k = \alpha \cdot A_{k+1}$ with the slope coefficient α being inferior to one), and
  reducing the number of candidates estimates obtained by applying the decoding algorithm $D_k$.

In certain embodiments, the threshold $Rth_k$ used at step 408 to enumerate candidate points of the candidate set $\Gamma_k$ may be a function of a target quality of service indicator $Q_{target}$ (also referred to hereinafter as "QoS indicator"). In particular, the target quality of service indicator $Q_{target}$ may be the target diversity order that is to be reached $d_{target}$. By limiting the number of candidate points to enumerate at each iteration of step 408 by a threshold $Rth_k$ depending on a target quality of service indicator $Q_{target}$, this ensures that the target quality of service indicator is effectively reached or approached. The threshold $Rth_k$ may be a threshold defined per block k or a threshold defined for a set of blocks or for all the blocks $s^{(k)}$.

As used herein, the expression "target quality of service indicator" refers to a parameter related to the target QoS that is to be achieved, such as the target diversity order, the target complexity of the decoder, the target error probability, etc. The following description of certain embodiments of the invention will refer mainly to a target QoS indicator represented by the target diversity order, for illustration purpose only.

Figure 5:
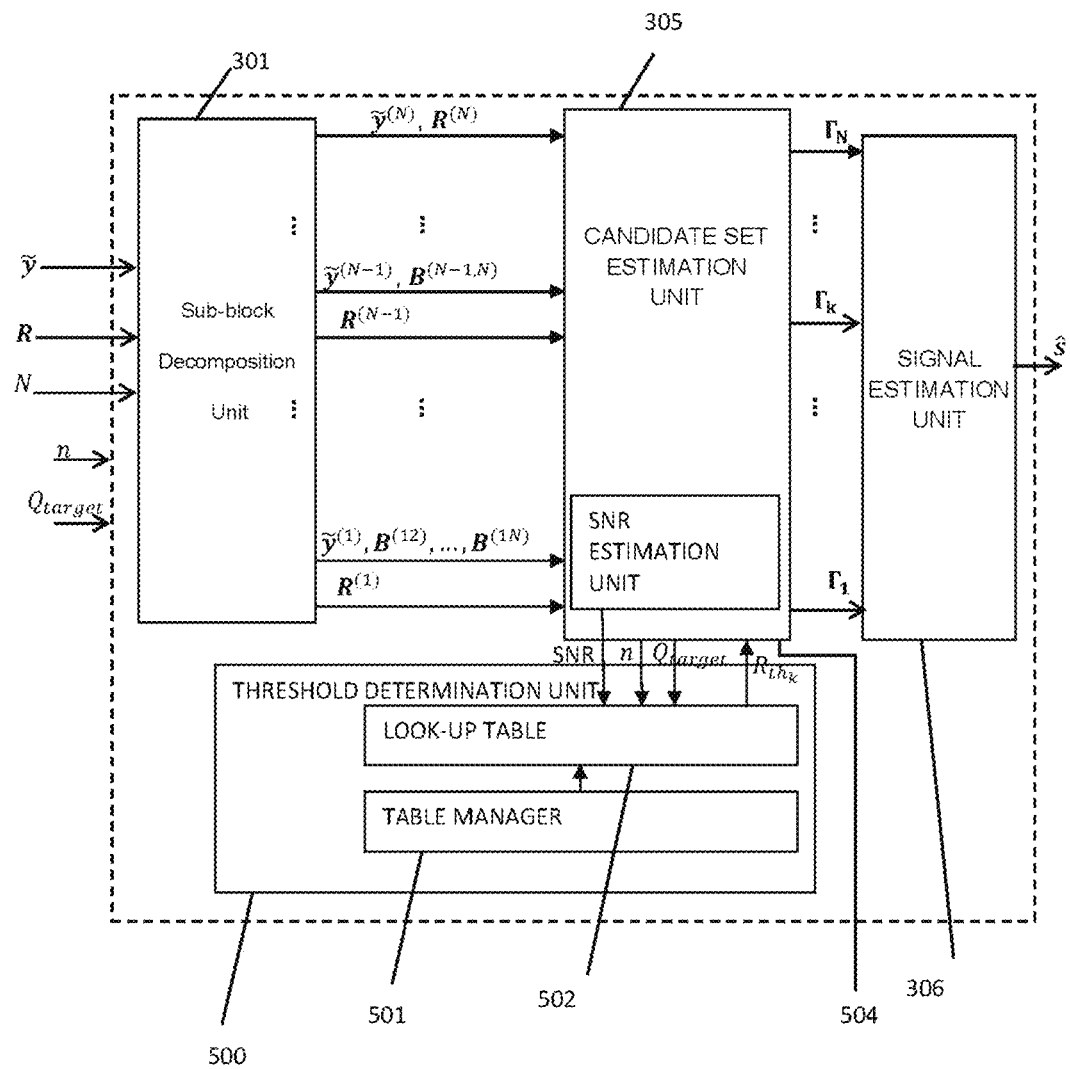
FIG. 5 is a block diagram representing a sub-block detection device according to another embodiment of the present invention.

With reference to FIG. 5, the decoder 110 may comprise a threshold estimation unit 500 comprising a look-up table 501 configured to provide the value of the threshold $R_{th_k}$ for the estimation of each data set $\Gamma_k$, from:
  the QoS indicator $Q_{target}$,
  the dimension of the received signal n (equal to $2n_r$ for uncoded systems or $2n_rT$ for encoded systems with T corresponding to the temporal dimension of the space time code), and
  the Signal-To-Noise Ratio (SNR).

The SNR may be estimated by an SNR estimation unit 504 provided in the candidate set estimation unit 305 or more generally in the decoder 110. The threshold estimation unit 500 may further comprise a look-up table manager 501 for updating the look-up table based on statistical data collected during the decoding of a previous data stream.

In embodiments where the decoder 110 receives a target QoS indicator $Q_{target}$ corresponding to the target diversity order $d_{target}$ and applies a sub-block decoding of the received signal into a number N=2 of sub-blocks, it has been found the threshold values of the look-up table may be predetermined from the probability that a selected path corresponding to the first sub-block be not visited during a tree search implemented by the decoding algorithm applied for the first sub-vector to determine the candidate estimates for the first sub-block and the signal-to-noise ratio, and in particular by solving the following equation:

$$\frac{\Gamma\left(p, \frac{r^2}{2\sigma^2}\right)}{\Gamma(p)} = \frac{1}{(\rho)^{d_{target}}} \quad (21)$$

In equation 21, $\sigma^2$ designates the noise variance, p designates the size of the second block, ρ the SNR and r is an unknown variable corresponding to the threshold $Rth_k$ to be determined. Γ(x, y) designates the Gamma Function $$(\frac{\Gamma\left(p, \frac{r^2}{2\sigma^2}\right)}{\Gamma(p)} = \int_{\frac{r^2}{\sigma^2}}^{\infty} f(x)dx$$

with f being the probability density function of $\chi^2(p)$ (chi-squared distribution) and $$\frac{\Gamma(\alpha, x)}{\Gamma(\alpha)}$$

is the normalized upper Gamma function).

The first term $$\frac{\Gamma\left(p, \frac{r^2}{2\sigma^2}\right)}{\Gamma(p)}$$

corresponds to the probability that a selected path corresponding to the first sub-block be not visited during a tree search implemented by the decoding algorithm applied for said first sub-vector to determine the candidate estimates for the first sub-block. Equation 21 is equivalent to determining threshold values such that the probability that the normalized noise $$\frac{|z^{(1)}|^2}{\sigma^2}$$

related to the first sub-block is larger than a normalized threshold $$\frac{|r|^2}{\sigma^2},$$

the normalized noise $$\frac{|z^{(1)}|^2}{\sigma^2}$$

being distributed according to the $\chi^2(p)$.

For example, if the two blocks are respectively of length p and n–p (N=2), and an ML decoding algorithm $D_1$ for the processing of block $s^{(1)}$, each $R_{th_k}$ value of the look-up table may be theoretically predetermined by solving the following equation:

$$c_1\rho^{-n} + c_2\rho^{-n} + \frac{\Gamma\left(\frac{p}{2}, \frac{r^2}{2\sigma^2}\right)}{\Gamma\left(\frac{p}{2}\right)} = \left(\frac{1}{(\rho)^{d_{target}}}\right) \quad (22)$$

In equation 22, $c_1$ and $c_2$ designate positive value constants, $\sigma^2$ designates the noise variance, p designates the size of bloc, $\rho$ the SNR and r is an unknown variable corresponding to the threshold $Rth_k$ to be determined. $\Gamma(x, y)$ designates the Gamma Function.

The first term of equation 22

$$\left(c_1\rho^{-n} + c_2\rho^{-n} + \frac{\Gamma\left(\frac{p}{2}, \frac{r^2}{2\sigma^2}\right)}{\Gamma\left(\frac{p}{2}\right)}\right)$$

corresponds to the calculated Frame Error Probability (probability of having error per transmitted frame) when applying the ML decoding for the processing of block $s^{(1)}$ while the second term of equation 22

$$\left(\frac{1}{(\rho)^{d_{target}}}\right)$$

corresponds to target Frame Error Probability.

The first term of equation 22 from the probability of visiting a path that is outside the sphere of radius r using the ML decoding:

$$\left(Pr(|w^{(1)}|^2 \geq r^2) = \frac{\Gamma\left(\frac{p}{2}, \frac{r^2}{2\sigma^2}\right)}{\Gamma\left(\frac{p}{2}\right)}\right),$$

with $w^{(1)}$ designating the noise corresponding to block $s^{(1)}$.

In the first term of equation 22, the term that controls the achievable diversity order $d_{target}$ with the applied decoding scheme is $$\frac{\Gamma\left(\frac{p}{2}, \frac{r^2}{2\sigma^2}\right)}{\Gamma\left(\frac{p}{2}\right)},$$

while the term $c_1\rho^{-n} + c_2\rho^{-n}$ indicates a full diversity. Accordingly, each $R_{th_k}$ value of the look-up table may be predetermined by solving the following equation:

$$\frac{\Gamma\left(\frac{p}{2}, \frac{r^2}{2\sigma^2}\right)}{\Gamma\left(\frac{p}{2}\right)} = \left(\frac{1}{(\rho)^{d_{target}}}\right) \quad (23)$$

In another example, if the decoder 110 applies a sub-optimal decoding of the received signal into two blocks $s^{(2)}$ and $s^{(1)}$ respectively of length p and n–p (N=2), using a ZF-DFE decoding algorithm $D_1$ for the processing of block $s^{(1)}$, each $R_{th_k}$ value of the look-up table may be theoretically predetermined by solving the following equation:

$$N_e \frac{\epsilon}{1-\epsilon} + \frac{\Gamma\left(p, \frac{r^2}{2\sigma^2}\right)}{\Gamma(p)} = \left(\frac{1}{(\rho)^{d_{target}}}\right) \quad (24)$$

In equation 24, $N_e$ designates the average number of the nearest neighbors in the constellation, using a nearest neighbor union bound, $\sigma^2$ designates the noise variance, p designates the size of block $s^{(2)}$, $\rho$ the SNR and r is an unknown variable corresponding to the threshold $Rth_k$ to be determined. $\Gamma(x, y)$ designates the Gamma Function. Further $\epsilon$ is given by the following formula $$\epsilon = \frac{1}{1 + \frac{d_{min}^2}{4\sigma^2}},$$

with $d_{min}$ representing the minimal distance of the constellation. The first term of equation 24

$$\left(N_e \frac{\epsilon}{1-\epsilon} + \frac{\Gamma\left(p, \frac{r^2}{2\sigma^2}\right)}{\Gamma(p)}\right)$$

has been obtained from the fact that the probability $P_r(E_{p+1})$ of decoding the wrong symbol $s_{p+1}$ satisfies $P_r(E_{p+1}) \leq N_e \epsilon$.

In the first term of equation 24, the term that controls the achievable diversity order $d_{target}$ with the applied decoding scheme is $$\frac{\Gamma\left(p, \frac{r^2}{2\sigma^2}\right)}{\Gamma(p)},$$

while the additive term $$N_e \frac{\epsilon}{1-\epsilon}$$

represents the degradation of performance caused by the use of ZF-DFE in the second decoding stage corresponding to the processing of block $s^{(2)}$. Accordingly, each $R_{th_k}$ value of the look-up table may be predetermined by solving the following equation:

$$\frac{\Gamma\left(p, \frac{r^2}{2\sigma^2}\right)}{\Gamma(p)} = \frac{1}{(\rho)^{d_{target}}} \quad (25)$$

In some embodiments, the decoder 110 may receive a target QoS indicator $Q_{target}$ corresponding to the target diversity order $d_{target}$ and apply a sub-block decoding of the received signal into a number N≥2 of sub-blocks of sizes $p_1, \ldots, p_N$. In such embodiments, the threshold values of the look-up table may be predetermined from an analysis of the error probability, the analysis enabling the derivation of a threshold value $r_{i,th}$ in correspondence with each sub-block $s^{(i)}$ of length $p_1$.

The analysis of the error probability may be derived considering equal or different sub-block sizes. Moreover, the error probability may depend on the decoding algorithm used in the last stage. For example, when an ML decoder is implemented for the processing of block $s^{(1)}$, the frame error probability may be upper bounded according to:

$$P_{err} \leq \frac{|I| + \mathcal{A}^{PN}}{\left(1 + \frac{d_{min}^2}{4\sigma^2}\right)^n} + \sum_{i=1}^{N-1} \frac{\Gamma\left(\frac{\sum_{j=1}^{i} p_j}{2}, \frac{r_i^2}{2\sigma^2}\right)}{\Gamma\left(\frac{\sum_{j=1}^{i} p_j}{2}\right)} \quad (26)$$

In equation (26):
I designates a set of selected paths visited by the vector corresponding to all the sub-blocks of the vector s during the tree search;
$r_i$ for i=1, . . . , N, designates the unknown variable corresponding to the threshold $r_{i,th}$ to be determined.

Accordingly, each value $r_{i,th}$ for i=1, . . . , N of the look-up table may be predetermined according to the satisfaction of the following inequality:

$$\frac{\Gamma\left(\frac{\sum_{j=1}^{i} p_j}{2}, \frac{r_i^2}{2\sigma^2}\right)}{\Gamma\left(\frac{\sum_{j=1}^{i} p_j}{2}\right)} \leq \delta\sigma^{2d} \quad (27)$$

In inequality (27), δ designates a positive constant that enables to control the signal-to-noise ratio gain. Inequality (27) may be solved numerically in simulations with a margin of error as small as possible.

Given the determined thresholds, the decoder 110 may be configured to perform sub-block decoding of the N≥2 sub-blocks of sizes $p_1, \ldots, p_N$ according to the following steps:
1) estimate the sets $\Gamma_k$ for k=2, . . . , N by applying the decoding algorithms $D_k$ corresponding to each sub-block;
2) sort the candidates in the set $\Gamma_{N-1}$ according to an increasing order of the cumulated metrics;
3) find, for each candidate in the set $\Gamma_{N-1}$, the candidates in the set $\Gamma_1$ using an ML decoder $D_1$ and stop when the cumulated metric of the currently examined candidate is lower than or equal to the cumulated metric of the next candidate stored in the set $\Gamma_{N-1}$.

Figure 6:
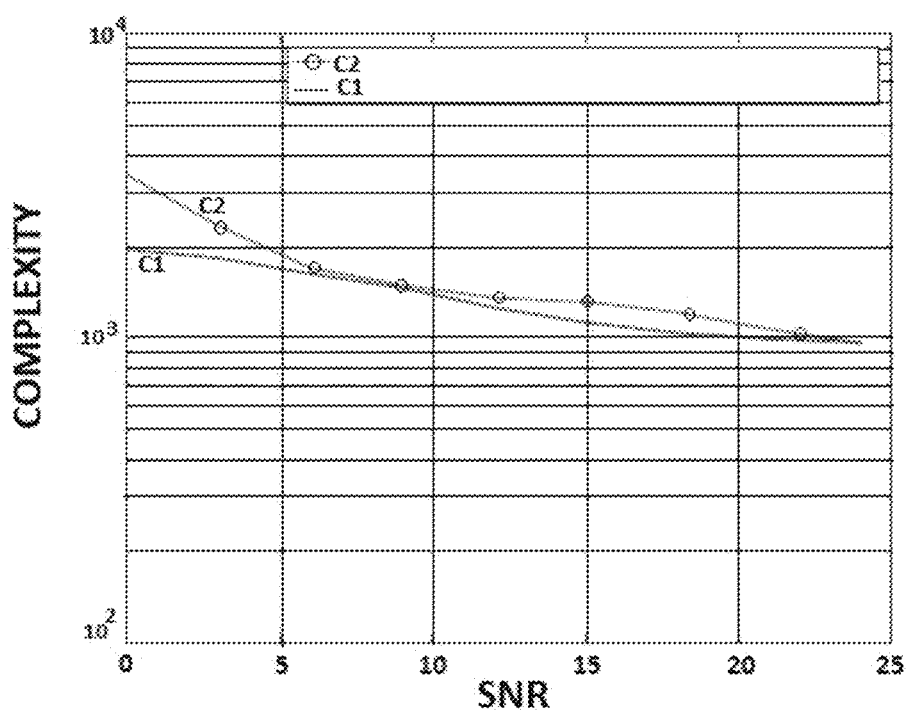
FIG. 6 is a diagram representing the performance obtained with a decoder according to certain embodiments.
Figure 7:
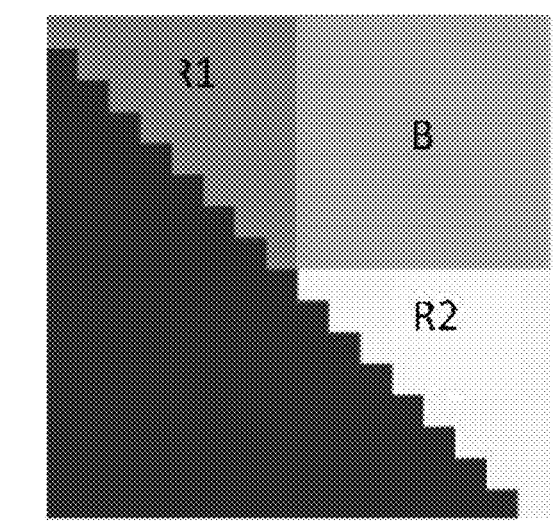
FIG. 7 represents an exemplary upper triangular matrix divided into two upper triangular.

FIG. 6 is a diagram representing the performance obtained with a decoder 110 according to certain embodiments (curve C1) for a 4×4 MIMO coded system with perfect code and using a 4-QAM constellation. The complexity was computed as the overall number of multiplications. The Perfect Code encodes 16 complex symbols (32 real symbols). Different examples of block division of the R matrix exist for this code. The division represent in FIG. 7 has been used to obtain the diagram of FIG. 6. The upper triangular matrix R represented in FIG. 7 was divided into two upper triangular matrix $R^{(1)}$=R1 (matrix of dimension 18×8) and $R^{(2)}$=R2 (matrix of dimension 28×8), and a rectangular matrix B. Considering real symbols, R1 ∈ $\mathbb{R}^{16 \times 16}$ and R2 ∈ $\mathbb{R}^{16 \times 16}$. Using the 4-QAM constellation, only 50 candidates over $2^{16}$=65356 possible solutions were considered for $\Gamma_2$ ($A_2$=50). It should be noted that in the example considered for the simulation, the number of potential candidates considered in decoding step corresponding to $s^{(2)}$ is not optimal. In FIG. 6, the curve C2 corresponds to a conventional sphere decoder. FIG. 6 shows that the complexity remains substantially constant obtained with the recursive decoder 110 of the invention is reduced compared to the complexity achieved with a conventional sphere decoder. It should be noted that the loss of 3 dB at SNR=$10^{-3}$ can be compensated for by optimizing the number of candidates selected in the candidate set $\Gamma_2$.

Figure 13:
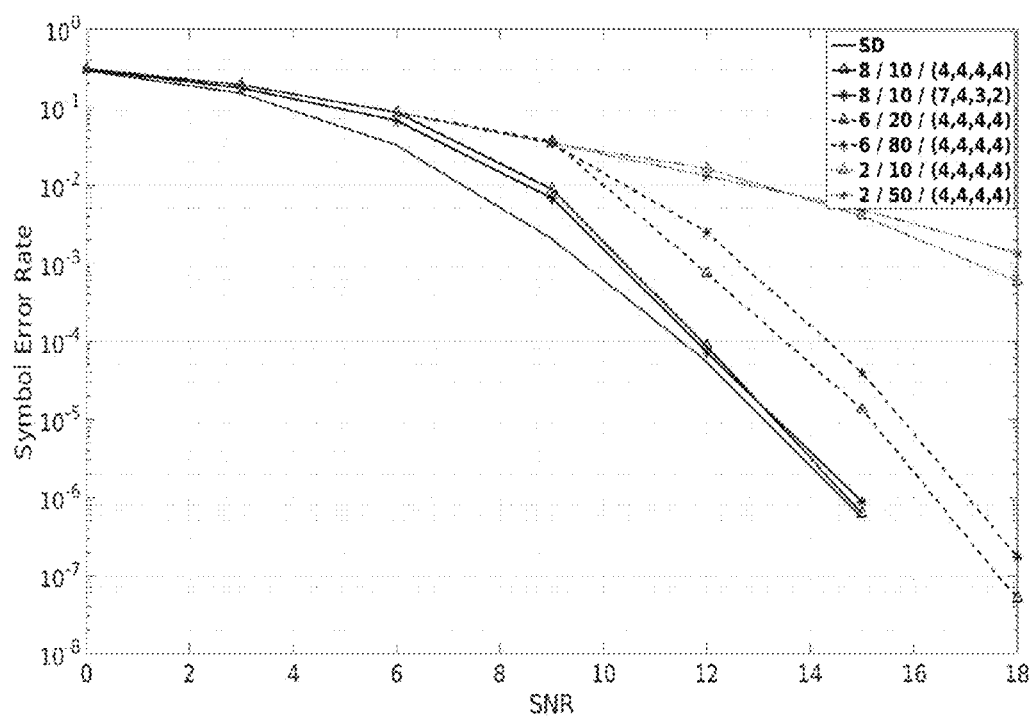
FIG. 13 is a diagram illustrating the symbol error rate as a function of the signal-to-noise ratio obtained in an exemplary application of the invention to an 8×8 spatial multiplexing system, according to some embodiments.
Figure 14:
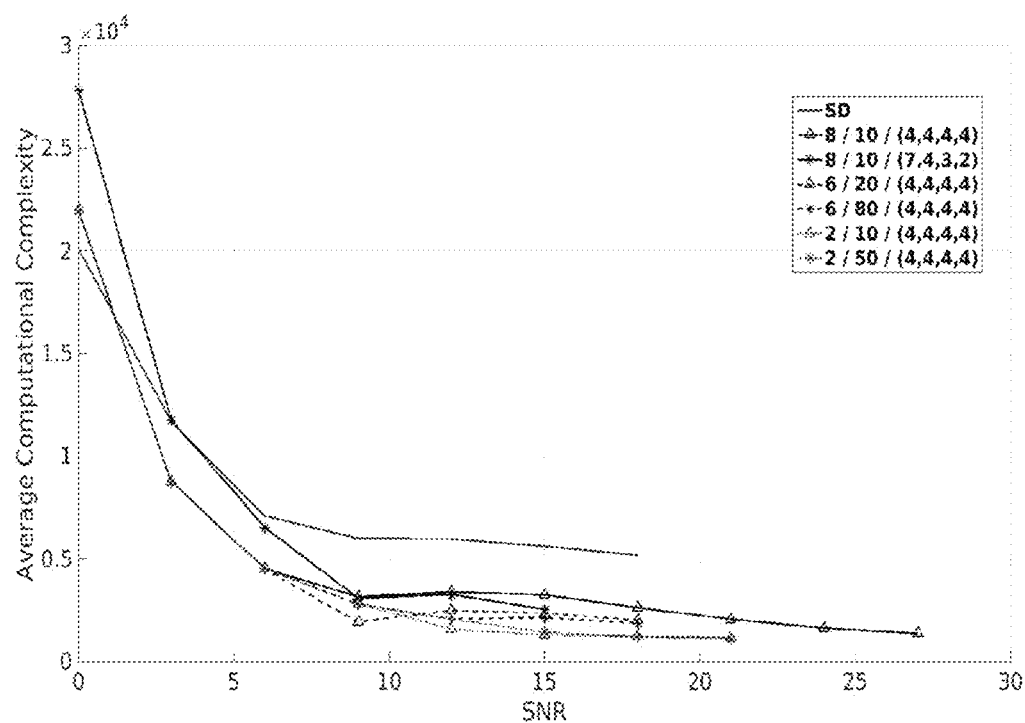
FIG. 14 is a diagram illustrating the average computational complexity as a function of the signal-to-noise ratio obtained in an exemplary application of the invention to a 4×4 spatial multiplexing system, according to some embodiments.

FIGS. 13 and 14 represent diagrams respectively illustrating the symbol error rate performance and the average computational complexity obtained with a decoder 110 according to some embodiments for an 8×8 spatial multiplexing MIMO system using 4-QAM modulations. FIGS. 13 and 14 correspond to a division of the upper triangular matrix R into 4 upper triangular matrices. The various curves shown in FIGS. 13 and 14 correspond to different scenarios in which the same or a different length of each of the sub-blocks is used. The legend in both figures is written as follows: d/SNR gain/$p_1 p_2 p_3 p_4$ with d designating a target diversity order, SNR gain designating the gain in the signal-to-noise ratio, and $p_1 p_2 p_3 p_4$ designate the lengths of the sub-blocks considered for the division of the upper triangular matrix into 4 upper triangular matrices. In addition, in FIGS. 13 and 14 the reference "SD88" corresponds to the curves obtained using traditional sphere decoding algorithm for decoding the information symbols. FIGS. 13 and 14 show that the various embodiments of the invention provide a flexibility on achieving a target diversity order with a reduced computational complexity. In particular, it is shown that any target diversity order is always achievable and that an additive signal-to-noise ratio gain is obtained using various values of the lengths of the sub-blocks. It should be noted that the error performance and computational complexity are sensitive to the lengths of the sub-blocks. More specifically, the best error performance is achieved with the highest length $p_1$ of the first sub-block and the highest average complexity increases as the length $p_4$ increases.

The recursive sub-block decoding method and device according to the embodiments of the invention thus allows to efficiently control the target diversity order while ensuring a reduced complexity. The complexity reduction can be optimized depending on the number of candidate estimates selected in the candidate set $\Gamma_k$ associated with each sub-block $s^{(k)}$, the type of the lattice decoding algorithm $D_k$ selected for the decoding of each sub-block $s^{(k)}$, and/or the order according to which the sub-blocks $s^{(k)}$ are processed.

Figure 8:
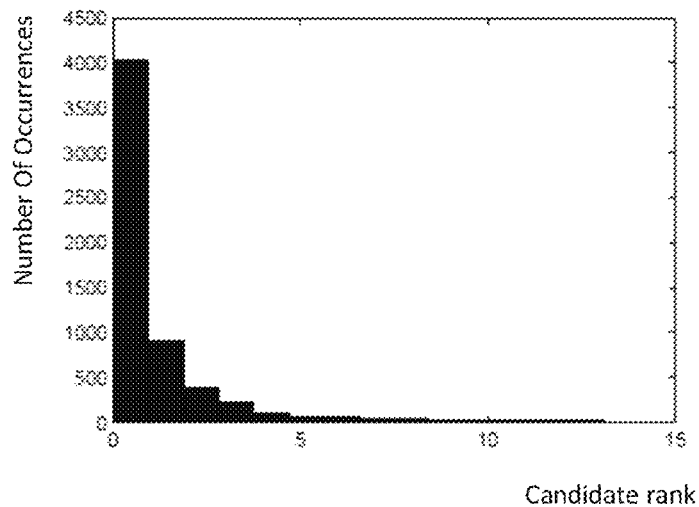
FIGS. 8 to 10 are diagrams illustrating exemplary empirical distributions obtained for different values of the SNR, in an exemplary application of the invention to a coded system.
Figure 9:
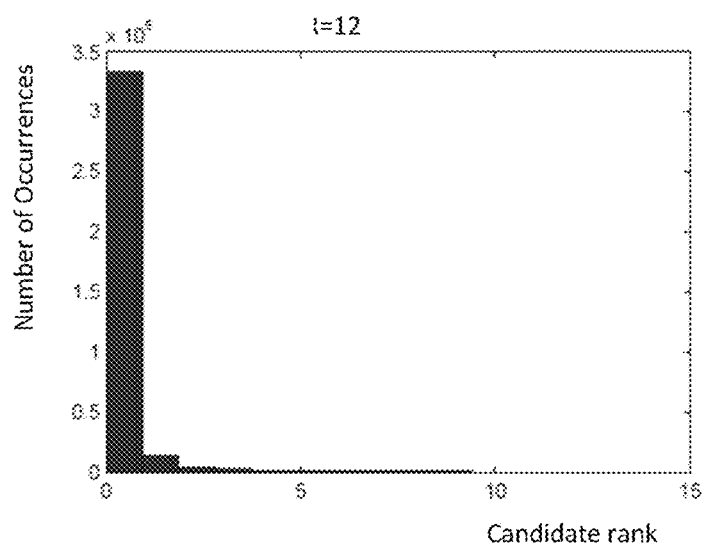
Figure 10:
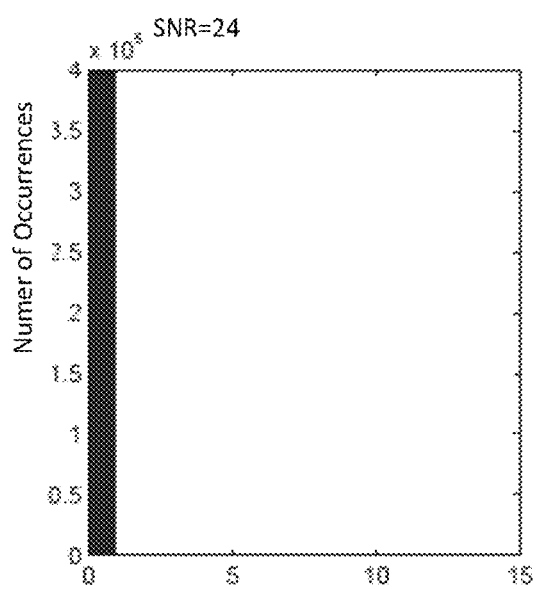

The diagrams of FIGS. 8 to 10 illustrate different empirical distributions obtained for different values of the SNR, in an exemplary application of the invention to a coded system using a Golden Code with 4-QAM constellation with a number of blocks N equal to 2 blocks. More specifically, these figures show the occurrence of each candidate value rank over previous decoding of data streams, in an application of the invention to sub-decoding into N=2 blocks, in embodiments where each candidate set $\Gamma_k$ is ordered by increasing value of the cumulated metric, such statistical data may be determined from the occurrence of each candidate value rank over previous decoding of data streams. As can be seen, the local ML solution corresponding to the first rank $s_1^{(2)}$ in our list is the most frequently selected candidate in the candidate set $\Gamma_2$. Such statistical distribution may be used to limit the number of candidates maintained in each candidate set $\Gamma_k$ (by further selecting a set of candidates matching a target number derived from such statistical data in step 408) or alternatively by updating the threshold $R_{th_k}$ based on the statistical data to limit the number of candidate estimates in each candidate set $\Gamma_k$ (such update may be implemented by block 501 for example).

Figure 11:
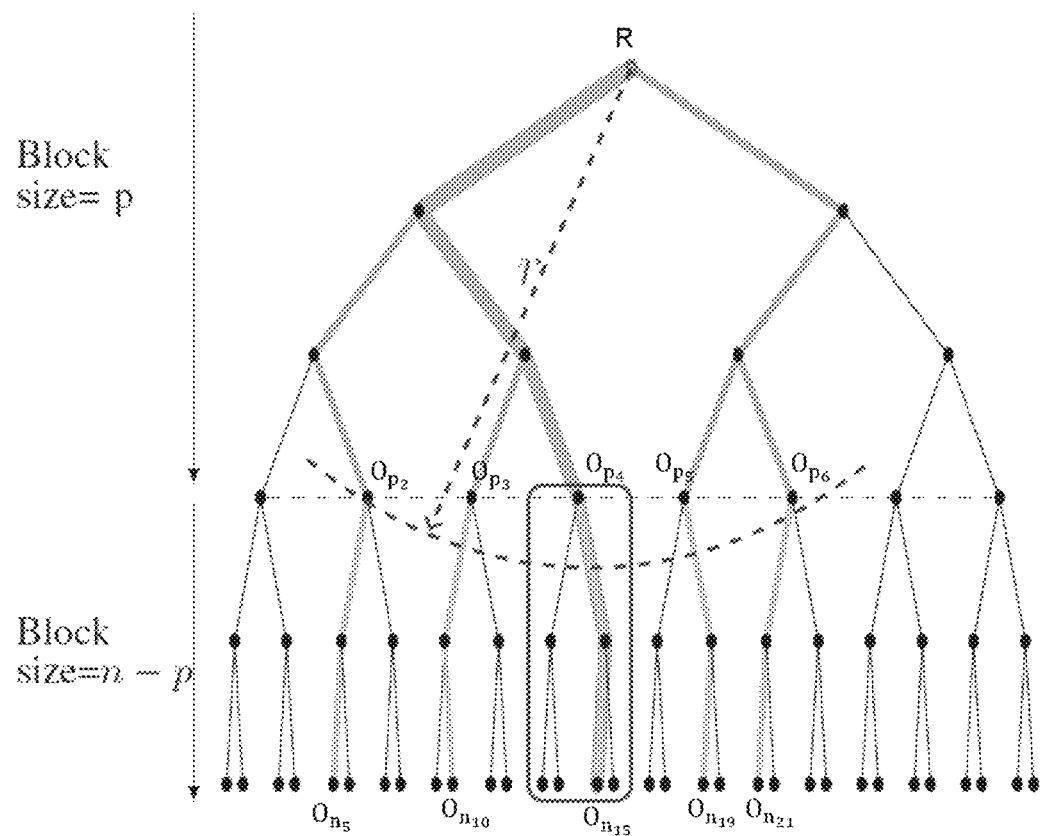
FIG. 11 shows an exemplary tree representation of a division of the R matrix into two-sub-blocks and the corresponding decoding of the sub-vectors of symbols.

FIG. 11 shows a tree representation of a division of the R matrix into two-sub-blocks (N=2) and the corresponding decoding of the sub-vectors of symbols (with $s^{(2)}$ of length p and $s^{(1)}$ of size n–p).

FIG. 11 shows the threshold $R_{th_k}$ corresponding to the radius r of the sphere delimiting the search space. Further, in FIG. 11:

- paths [$RO_{p_i}$], with R corresponding the root node and $O_{p_i}$ the node at level p in the tree, designate the candidate sub-vectors selected in the candidate set $\Gamma_2$;
- paths [$O_{p_i}O_{n_j}$], with $O_{p_i}$ corresponding to the i-th node at level p in the tree and $O_{p_j}$ corresponding to the j-th node at level p in the tree, designate the complete paths corresponding the candidates selected in the candidate set $\Gamma_2$ and the candidate selected in the candidate set $\Gamma_1$;
- paths [$RO_{n_{15}}$] designate the estimate of the transmitted signal;
- the other branches are part of the unselected sub-vectors of information symbol.

Although the invention has been described in relation with a division of the received signal derived from a division of the upper triangular matrix R derived from the real channel matrix, the sub-block semi-exhaustive decoding method may be performed alternatively from the complex vectorized channel output. Accordingly, the division into sub-blocks may be performed from the complex channel matrix instead of using the real channel matrix.

Further, while the invention has been described in relation with certain examples of division into two blocks, and certain examples of the upper triangular matrix R, the invention is not limited to a particular number of blocks or configuration of the upper triangular matrix.

More generally, even if the semi-exhaustive sub-decoding method and device of the invention have particular advantages when the division of the received signal is derived from a division of the upper triangular matrix R, semi-exhaustive sub-decoding method and device may use alternatively another matrix related to the channel matrix H to derive the division of the received signal therefrom. For example, in one application of the invention to a coded system using a space-time block code (STBC) to encode the digital data sequence at the transmitter side, an encoded signal is sent over the transmission channel and comprises q sets of independent symbols. The signal sent over the transmission channel is denoted by a codeword matrix X, with $X \in \mathbb{C}^{n_t \times T}$, with X belonging to a codebook C. For a linear space-time block code, the codeword matrix X admits a linear dispersion representation in the form:

$$X = \sum_{i=1}^{q} (\Re(s_i)A_{2i-1} \Im(s_i)A_{2i}) \qquad (28)$$

In Equation (26), $\Re(s_i)$ and $\Im(s_i)$ correspond respectively to the real and imaginary parts of the $s_i$ complex information symbols and matrices $A_l$ represent the linear dispersion matrices (also referred to as LD matrices).

The received signal at the receiver side can be written as:

$$Y = HX + W \qquad (29)$$

The received signal may be vectorized as follows:

$$\text{vec}(Y) = H_{eq}s + \text{vec}(W) \qquad (30)$$

The operator vec(.) is defined as the operator that stacks the m columns of an n×m complex-valued matrix into an mn complex column vector.

In equation (28), $H_{eq}$ designates the equivalent channel matrix of dimension $n_r \times q$ given by:

$$H_{eq} = (I_T \otimes H)G \qquad (31)$$

The vector s is obtained by vectorizing the codeword matrix X according to:

vec(X)=Gs, with G representing a generator matrix of the used linear STBC.

$H_{eq}$ can be rewritten as a function of the LD matrices as follows:

$$H_{eq} = [\text{vec}(A_1H) | \text{vec}(A_2H) | \ldots | \text{vec}(A_{2k}H)] \qquad (31)$$

The vectorized complex system can be rewritten as:

$$y = H_{eq}s + w \qquad (32)$$

In such coded embodiment of the invention, the sub-block decomposition unit 301 may be configured to divide the equivalent received vector y into N sub-vectors $y^{(k)}$, and to decompose the equivalent channel matrix $H_{eq}$ in correspondence with the division of the received vector. The equivalent channel matrix $H_{eq}$ is divided into N rectangular sub-matrices $H_{eq}^{(k)}$, with k=1, ..., N, each sub-matrix $H_{eq}^{(k)}$ representing a rectangular matrix of dimension $n_r \times l_k$ and composed of $l_k$ column vectors of the equivalent channel matrix $H_{eq}$:

$$H_{eq} = [H_{eq}^{(1)} | \ldots | H_{eq}^{(k)} | \ldots | H_{eq}^{(N)}]$$

The received signal vector y is divided into N sub-vectors $y^{(k)}$, k=1, ..., N of lengths $l_k$ such that $$y = \begin{bmatrix} y^{(1)} \\ \vdots \\ y^{(N)} \end{bmatrix}$$

and $\sum_{k=1}^{N} l_k = n$. The same vector division is applied to the vector of symbols s to obtain N sub-vectors $s^{(k)}$, k=1, ..., N of lengths $l_k$ such that $$s = \begin{bmatrix} s^{(1)} \\ \vdots \\ s^{(N)} \end{bmatrix}.$$

In some embodiments, the equivalent channel sub-matrices may be reordered depending on the determinant of the product $(H_{eq}^{(k)})^H . H_{eq}^{(k)}$ (Superscripts "$.^H$" denotes Hermitian transposition):$\det((H_{eq}^{(k)})^H . H_{eq}^{(k)})$, such that the sub-vector $s^{(k)}$ that corresponds to the sub-matrix of maximum determinant of the product $(H_{eq}^{(k)})^H . H_{eq}^{(k)}$ is placed in the first position (k=N). The reordered equivalent channel sub-matrices are denoted: $[H_{eq}^{(1')} | \ldots | H_{eq}^{(k')} | \ldots | H_{eq}^{(N')}]$. The same reordering is applied to the vector of symbols s in order to obtain an equivalent system.

Accordingly, equation (32) can be rewritten as:

$$\begin{bmatrix} y^{(1)} \\ \vdots \\ y^{(N)} \end{bmatrix} = [H_{eq}^{(1')} | \ldots | H_{eq}^{(k')} | \ldots | H_{eq}^{(N')}] \cdot \begin{bmatrix} s^{(1)} \\ \vdots \\ s^{(N)} \end{bmatrix} + \begin{bmatrix} w^{(1)} \\ \vdots \\ w^{(N)} \end{bmatrix} \quad (33)$$

In equation (33), $s^{(N)}$ and thus $H_{eq}^{(N')}$ correspond to the sub-matrix having the maximum determinant of the product $(H_{eq}^{(k)})^H . H_{eq}^{(k)}$.

The candidate set estimation unit 305 may then determine a set of candidate estimates $\Gamma_k$ for each block $s^{(k)}$ as described above, the candidate sets $\Gamma_1, \ldots, \Gamma_N$ being used to determine an estimates of the transmitted signal, according to step 405 to 410 of FIG. 4.

Figure 12:
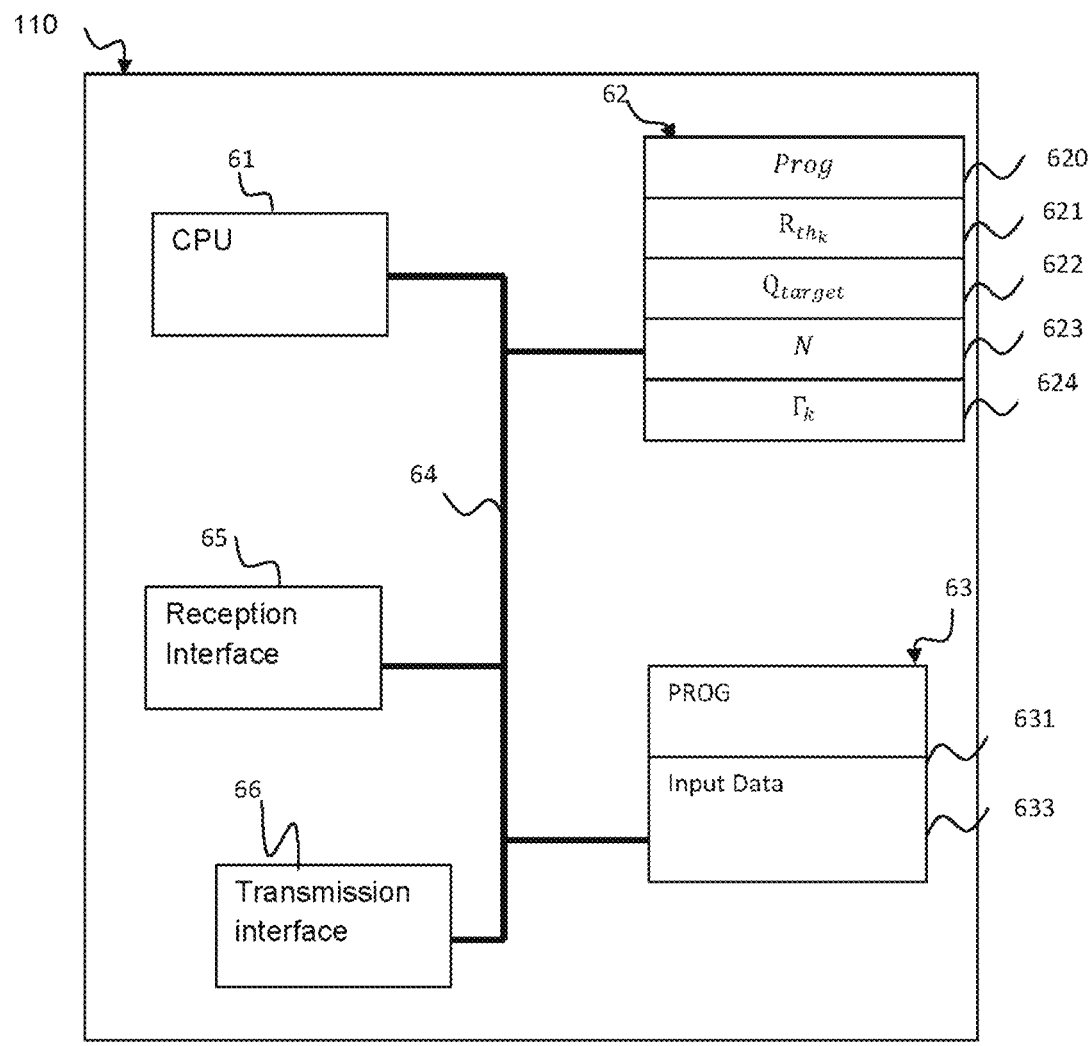
FIG. 12 is a block diagram of an exemplary hardware architecture of a decoder according to certain embodiments.

FIG. 12 represents an exemplary architecture of a space/time decoder 110 of the receiver 3 in a SB-stack embodiment of the invention. As shown, the space-time decoder 110 may include the following elements, which are linked together by a data and address bus 64:

a microprocessor 61 (or CPU), which is, for example, a digital signal processor (DSP);
a non-volatile memory 62 (or ROM, read-only memory);
a random access memory RAM 63;
an interface 65 for receiving input signals coming from the time/frequency converter;
an interface 66 for transmitting decoded data to the demodulator 31.

The non-volatile ROM memory 62 may include for example:

a register "Prog" 620;
The thresholds $Rth_k$ or alternatively the look-up table 621;
the target quality of service indicator target 622;
The number 623 of blocks N; and
The candidate sets $\Gamma_k$ which may be stored in the form of data structures 624.

The algorithms for implementing the method according to this embodiment of the invention can be stored in the program 620. The CPU processor 41 may be configured to download the program 620 to the RAM memory and runs the corresponding instructions. Specifically, the CPU comprises instructions that, when executed by the CPU, cause the CPU to:

divide the received signal vector into a set of sub-vectors $\tilde{y}_k$, in correspondence with a division of the matrix related to said channel matrix (such as matrix R derived from the QR decomposition); and
recursively determine candidate estimates of the sub-blocks $s^{(k)}$ of the transmitted signal corresponding to said sub-vectors $\tilde{y}_k$, such that each estimate of a given sub-block being determined from at least one candidate estimate of the previously processed sub-blocks.

The CPU is caused to determine a set of candidate estimates $\Gamma_k$ for at least one sub-block $s^{(k)}$ of the transmitted signal by applying at least one iteration of a decoding algorithm $D_k$ using the estimates $\Gamma_{k+1}, \ldots, \Gamma_N$ determined for the previously processed sub-blocks, the number of candidate estimates determined for said sub-block being strictly inferior to the cardinal of the set of values from which the information symbols are selected. The CPU is further caused to calculate an estimate of the transmitted signal from the candidate estimates $\Gamma_1, \ldots, \Gamma_N$ determined for the sub-blocks.

The RAM memory 63 may include:

in a register Prog 630, the program run by the microprocessor 61 and downloaded in an active mode of the space-time decoder 30;
input data in a register 631.

More generally, the decoding techniques described herein may be implemented by various means. For example, these techniques may be implemented in hardware, software, or a combination thereof. For a hardware implementation, the processing elements of decoder can be implemented for example according to a hardware-only configuration (for example, in one or more FPGA, ASIC or VLSI integrated circuits with the corresponding memory) or according to a configuration using both VLSI and DSP.

While the invention has been described in relation with a wireless communication system, it should be noted that the invention is not limited to such applications. For example, the decoding device and method may be integrated in a signal processing apparatus, for example electronic filters of finite impulse response (FIR) used in audio applications such as audio crossovers and audio mastering, to decode an output sequence from a given input sequence. Given an input sequence of data, the output sequence of a FIR filter of order M is a weighted sum of the recent input values observed in a sliding window of size M. Given the lattice representation in the model of the output sequence, certain embodiments of the invention may be accordingly integrated to generate an estimate of the input sequence.

In another application, methods, devices and computer program products according to some embodiments of the invention may be implemented in a Global Navigation Satellite System (GNSS), such as IRNSS, Beidou, GLONASS, Galileo; GPS comprising for instance at least a GPS receiver for estimating positioning parameters using for example carrier phase measurements.

Further, methods, devices and computer program products according to some embodiments of the invention may be implemented in cryptographic systems for determining estimates on private secret values used in a cryptographic algorithm for encrypting/decrypting data or messages during their storage, processing or communication. In lattice-based cryptography applications, data/messages are encrypted in the form of lattice points. The decryption of such encrypted data may be advantageously performed according to some embodiments of the invention, enabling for a high probability of success recovery of secret values with a reduced complexity.

More generally, while embodiments of the invention have been illustrated by a description of various examples, and while these embodiments have been described in considerable detail, it is not the intent of the applicant to restrict or in any way limit the scope of the appended claims to such detail. Particularly, the invention is not limited to particular types of lattice decoder. More generally, any type of lattice decoder may be used in step 408 such as any sequential decoder using a best-first tree-search to search for candidate lattice vectors like the Stack decoders, the Fano decoders, the decoders implementing the M-algorithm, the SB-Stack and the Zigzag Stack decoder as described in patent application EP N° 14306517.5.

The invention claimed is:

1. A decoder for decoding a signal received through a transmission channel in a communication system, said signal carrying information symbols selected from a given set of values and being associated with a signal vector, said transmission channel being represented by a channel matrix, wherein said decoder comprises:
a sub-block division unit configured to divide the signal vector into a set of sub-vectors in correspondence with a division of a matrix related to said channel matrix;
a candidate set estimation unit for recursively determining candidate estimates of sub-blocks of the transmitted signal corresponding to said sub-vectors, each estimate of a given sub-block being determined from at least one candidate estimate of the previously processed sub-blocks,
wherein said candidate set estimation unit is configured to determine a set of candidate estimates for at least one sub-block of the transmitted signal by applying at least one iteration of a decoding algorithm using the estimates determined for the previously processed sub-blocks, the number of candidate estimates determined for said sub-block being inferior to the cardinal of said given set of values, the decoder further comprising a signal estimation unit for calculating an estimate of the transmitted signal from said candidate estimates determined for said sub-blocks.

2. The decoder of claim 1, wherein the decoder is configured to previously determine an orthogonal matrix Q and an upper triangular matrix R by performing a QR decomposition from said channel matrix, and said sub-block division unit is configured to divide said upper triangular matrix R into a number of upper triangular sub-matrices and a number of rectangular matrices, said number of upper triangular sub-matrices being superior or equal to two, said sub-block division unit being configured to divide the signal vector into a set of sub-vectors such that each sub-vector of the signal vector corresponds to one of the upper triangular sub-matrices.

3. The decoder of claim 2, wherein said decoder is provided to determine said signal vector by multiplying the transpose matrix of the orthogonal matrix with said received signal.

4. The decoder of claim 3, wherein said decoder is further arranged to determine a set of permuted matrices from the channel matrix by permuting rows or columns of said channel matrix, and to perform a QR decomposition of each permuted matrix to determine intermediary upper triangular matrices, the decoder being configured to select one of said permuted matrices from a criterion related to the components of the intermediary upper triangular matrix obtained for each permuted matrix, said sub-block division unit dividing the upper triangular matrix R corresponding to the intermediary upper triangular matrix associated with said selected permuted matrix.

5. The decoder of claim 1, wherein said decoding algorithm is a lattice decoding algorithm.

6. The decoder of claim 5, wherein said lattice decoding algorithm is configured to solve a condition on a cumulated metric of each block with respect to a threshold.

7. The decoder of claim 6, wherein said lattice decoding algorithm is a sequential decoding algorithm, and said threshold is the cumulated metric threshold of the sequential decoding algorithm.

8. The decoder of claim 6, wherein said lattice decoding algorithm is a sphere constrained decoding algorithm, and said threshold is the initial radius of the sphere of the sphere constrained decoding algorithm.

9. The decoder of claim 6, wherein said threshold is determined from a target quality of service quality indicator.

10. The decoder of claim 9, wherein the target quality of service indicator is the target diversity order.

11. The decoder of claim 9, wherein the decoder further comprises a threshold estimation unit configured to determine a threshold for the decoding of each sub-block.

12. The decoder of claim 11, wherein said threshold estimation unit is configured to determine said threshold from the target diversity order and from at least one further parameter chosen among a group consisting of an estimate of the signal to noise ratio, the dimension of the received signal, and the dimension of said sub-block.

13. The decoder of claim 12, wherein said threshold estimation unit comprises a lookup table storing a value of said threshold for each tuple of values comprising the value of the target diversity order and said at least one further parameter.

14. The decoder of claim 13, wherein the number of sub-blocks is equal to two and the threshold values of the look-up table are predetermined from the probability that a selected path corresponding to the first sub-block be not visited during a tree search implemented by the decoding algorithm applied for said first sub-vector to determine the candidate estimates for the first sub-block and the signal-to-noise ratio.

15. The decoder of claim 14, wherein said threshold estimation unit is configured to update said lookup table depending on statistical data related to the decoding of at least one other signal.

16. The decoder of claim 1, wherein each set of candidate estimates is a data structure ordered by increasing value of the cumulated metric obtained for each estimate.

17. The decoder of claim 1, wherein said candidate set estimation unit is configured to further reduce the number of candidates determined in the current set of candidate estimates for said at least one sub-block depending on a target number of candidate estimates associated with said sub-block.

18. The decoder of claim 17, wherein the target number of candidate estimates associated with said sub-block is determined from the number of candidate estimates of the previously processed sub-block.

19. The decoder of claim 18, wherein the target number of candidate estimates associated with said sub-block is a multiplicative function of the number of candidate estimates of the previously processed sub-block, said multiplicative function having a slope coefficient inferior to one.

20. The decoder of claim 1, wherein said candidate set estimation unit further comprises determining one estimate for the last processed sub-block by applying a decoding algorithm selected according to a predefined criteria.

21. The decoder of claim 20, wherein said decoding algorithm is chosen among a group consisting of a ML (Maximum Likelihood) decoding algorithm, a ZF-DFE (Zero Forcing-Decision Feedback Equalization) decoding algorithm, and a MMSE (Minimum Mean Square Error) coding algorithm.

22. The decoder of claim 1, wherein said signal estimation unit is configured to determine the tuple of estimates that minimizes the global metric, each tuple estimate comprising one candidate estimate from each one of the sets of candidate estimates obtained for the sub-blocks of information symbols.

23. The decoder of claim 1, wherein said communication system is a coded system using a space-time block code to encode the data signals transmitted over the transmission channel, said decoder being configured to vectorize said signal vector using an equivalent channel matrix, and divide the equivalent channel matrix into a number of rectangular equivalent channel sub-matrices, each rectangular sub-matrix being a function of the Linear Dispersion Matrix representing the signal sent over the transmission channel corresponding to the received signal, the sub-block division unit being configured to divide the signal vector into a set of sub-vectors in correspondence with said division of the equivalent channel matrix.

24. The decoder of claim 23, wherein the decoder is further configured to reorder said rectangular sub-matrices depending on the value of the determinant of the product of the Hermitian transposition of each equivalent channel sub-matrix with the equivalent channel sub-matrix.

25. A receiver for receiving and decoding an encoded signal, wherein the receiver comprises a decoder according to claim 1 for decoding said signal.

26. A mobile device capable of transmitting and receiving data in a wireless communication network, wherein the mobile device comprises a receiver according to claim 25 for receiving a signal.

27. A method of decoding a signal received through a transmission channel in a communication system, said signal carrying information symbols selected from a given set of values and being associated with a signal vector, said transmission channel being represented by a channel matrix, wherein said method comprises:
dividing the signal vector into a set of sub-vectors in correspondence with a division of a matrix related to said channel matrix;
recursively determining candidate estimates of sub-blocks of the transmitted signal corresponding to said sub-vectors, each estimate of a given sub-block being determined from at least one candidate estimate of the previously processed sub-blocks,
wherein said recursively determining estimates comprises, for at least one sub-block, determining a set of candidate estimates for said sub-block of the transmitted signal by applying at least one iteration of a decoding algorithm using the estimates determined for the previously processed sub-blocks, the number of candidate estimates determined for said sub-block being inferior to said given set of values, the method further comprising calculating an estimate of the transmitted signal from said candidate estimates determined for said sub-blocks.

28. The method of claim 27, wherein it further comprises:
determining an orthogonal matrix Q and an upper triangular matrix R by performing a QR decomposition from said channel matrix;
dividing said upper triangular matrix R into a number of upper triangular sub-matrices and a number of rectangular matrices, said number of upper triangular sub-matrices being superior or equal to two,
said dividing the signal vector into a set of sub-vectors comprising dividing each sub-vector of the signal vector in correspondence with one of the upper triangular sub-matrices.

29. A computer program product stored in a non-transitory computer storage medium for decoding a signal received through a transmission channel in a communication system, said signal carrying information symbols selected from a given set of values and being associated with a signal vector, said transmission channel being represented by a channel matrix, the computer program product comprising instructions for:
dividing the signal vector into a set of sub-vectors in correspondence with a division of a matrix related to said channel matrix;
recursively determining candidate estimates of sub-blocks of the transmitted signal corresponding to said sub-vectors, each estimate of a given sub-block being determined from at least one candidate estimate of the previously processed sub-blocks; and
determining a set of candidate estimates for at least one sub-block of the transmitted signal by applying at least one iteration of a decoding algorithm using the estimates determined for the previously processed sub-blocks, the number of candidate estimates determined for said sub-block being inferior to the cardinal of said given set of values, and calculating an estimate of the transmitted signal from said candidate estimates determined for said sub-blocks.

* * * * *